(12) United States Patent
Yu et al.

(10) Patent No.: US 12,184,990 B2
(45) Date of Patent: Dec. 31, 2024

(54) METHOD FOR PROVIDING IMAGE AND ELECTRONIC DEVICE SUPPORTING THE SAME

(71) Applicant: Samsung Electronics Co., Ltd., Gyeonggi-do (KR)

(72) Inventors: Sangjun Yu, Gyeonggi-do (KR); Kihuk Lee, Gyeonggi-do (KR); Valeriy Prushinskiy, Gyeonggi-do (KR); Hyungsok Yeo, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 129 days.

(21) Appl. No.: 17/954,544

(22) Filed: Sep. 28, 2022

(65) Prior Publication Data

US 2023/0319423 A1 Oct. 5, 2023

Related U.S. Application Data

(63) Continuation of application No. PCT/KR2022/014114, filed on Sep. 21, 2022.

(30) Foreign Application Priority Data

Oct. 12, 2021 (KR) .......................... 10-2021-0135142

(51) Int. Cl.
*H04N 23/76* (2023.01)
*G06T 5/00* (2024.01)
(Continued)

(52) U.S. Cl.
CPC ............... *H04N 23/76* (2023.01); *G06T 5/00* (2013.01); *G06T 5/50* (2013.01); *G06T 7/33* (2017.01);
(Continued)

(58) Field of Classification Search
CPC ........ H04N 23/76; H04N 23/90; H04N 23/45; H04N 23/57; H04N 23/80; H04N 23/54;
(Continued)

(56) References Cited

U.S. PATENT DOCUMENTS 10,200,623 B1 * 2/2019 Baldwin ................ H04N 23/63
11,558,556 B2 * 1/2023 Oh ........................ H04N 23/632
(Continued)

FOREIGN PATENT DOCUMENTS

CN  110491918 A  11/2019
CN  112929574 A  6/2021
(Continued)

OTHER PUBLICATIONS

International Search Report dated Dec. 29, 2022.

*Primary Examiner* — Kelly L Jerabek
(74) *Attorney, Agent, or Firm* — Cha & Reiter, LLC

(57) ABSTRACT

According to an embodiment, an electronic device may include a first camera configured to obtain an image using light introduced through a first area of a display and a second camera configured to obtain an image using light introduced through a second area of the display, the display including the first area, the second area, and a third area other than the first area and the second area and at least one processor. The first area may include a first light emitting unit and a first line connecting the first light emitting unit and a first light emitting circuit disposed in the third area, the first line being arranged in a first direction. The second area may include a second light emitting unit and a second line connecting the second light emitting unit and a second light emitting circuit disposed in the third area, the second line being arranged in a second direction different from the first direction.

18 Claims, 16 Drawing Sheets

(51) Int. Cl.
  *G06T 5/50*  (2006.01)
  *G06T 7/33*  (2017.01)
  *H04N 23/90*  (2023.01)
  *H10K 59/131*  (2023.01)
(52) U.S. Cl.
  CPC ........... *H04N 23/90* (2023.01); *H10K 59/131* (2023.02); *G06T 2207/20221* (2013.01); *G06T 2207/20224* (2013.01)
(58) Field of Classification Search
  CPC ...... H04N 23/56; H10K 59/65; H10K 59/131; G06T 5/00; G06T 5/50; G06T 7/33; G06T 2207/20221; G06T 2207/20224
  See application file for complete search history.

(56) References Cited

U.S. PATENT DOCUMENTS

| | | |
|---|---|---|
| 2019/0268535 A1 | 8/2019 | Jinno |
| 2019/0373229 A1 | 12/2019 | Zhang et al. |
| 2020/0117034 A1 | 4/2020 | Yin et al. |
| 2020/0195764 A1 | 6/2020 | Xu et al. |
| 2020/0303472 A1 | 9/2020 | Lou et al. |
| 2020/0373514 A1 | 11/2020 | Bai |
| 2020/0389575 A1 | 12/2020 | Gove |
| 2021/0100092 A1 | 4/2021 | Fang |
| 2021/0120150 A1 | 4/2021 | Moon |
| 2021/0167163 A1 | 6/2021 | Jeong et al. |
| 2021/0185785 A1 | 6/2021 | Cho et al. |
| 2021/0408200 A1 | 12/2021 | Zhao et al. |
| 2022/0320474 A1* | 10/2022 | Shin ................. H10K 50/865 |
| 2022/0406257 A1* | 12/2022 | Gu ........................ G09G 5/10 |

FOREIGN PATENT DOCUMENTS

| | | |
|---|---|---|
| CN | 113161374 A | 7/2021 |
| CN | 113299240 A | 8/2021 |
| JP | 2019-152910 A | 9/2019 |
| JP | 2020-150448 A | 9/2020 |
| KR | 10-2014-0020464 A | 2/2014 |
| KR | 10-2016-0031767 A | 3/2016 |
| KR | 10-2017-0024182 A | 3/2017 |
| KR | 10-2020-0014408 A | 2/2020 |
| KR | 10-2020-0138645 A | 12/2020 |
| KR | 10-2021-0027003 A | 3/2021 |
| KR | 10-2021-0046256 A | 4/2021 |
| KR | 10-2021-0069289 A | 6/2021 |
| KR | 10-2021-0074930 A | 6/2021 |
| WO | 2020/052192 A1 | 3/2020 |

* cited by examiner

METHOD FOR PROVIDING IMAGE AND ELECTRONIC DEVICE SUPPORTING THE SAME

CROSS-REFERENCE TO RELATED APPLICATION(S)

This application is a continuation of International Application No. PCT/KR2022/014114, which was filed on Sep. 21, 2022, and claims priority to Korean Patent Application No. 10-2021-0135142, filed on Oct. 12, 2021, in the Korean Intellectual Property Office, the disclosure of which are incorporated by reference herein their entirety.

BACKGROUND

Technical Field

Various embodiments of the disclosure relate to a method for providing an image and an electronic device supporting the same.

Description of Related Art

Users' demand is increasing for electronic devices that have been miniaturized and may provide a wider screen and improved aesthetic appearance. To meet such user demand, electronic devices are being introduced with notches, U-shaped holes, V-shaped holes, or O-shaped holes formed in a portion of the housing and the display for the camera module exposed through the notch or hole.

In contrast, to implement full screen, recent electronic devices are implemented with under display camera (UDC) technology.

SUMMARY

When the electronic device is implemented with UDC technology, the transmittance of light passing through the display and entering the camera may be lower than the transmittance of light entering the camera through a hole (e.g., U-shaped hole, V-shaped hole, or O-shaped hole) due to an opaque component (e.g., substrate made of polyimide) included in the display.

To increase the light transmittance of the display in the electronic device implemented with UDC technology, the electronic device may be implemented in such a way where light emitting units (e.g., RGB pixels) are disposed in the UDC area corresponding to the camera in the display (e.g., the area through which light is transmitted through the display to the camera), and a circuit for transferring data signals (e.g., data voltage and/or data current) to the light emitting unit is disposed in areas of the display other than the UDC area. In the electronic device implemented in such a way, the light emitting units disposed in the UDC area and the circuit for transferring data signals (e.g., data voltage and/or data current) to the light emitting units may be connected by electrical lines (e.g., transparent lines).

In the electronic device implemented in such a way, the image obtained through the camera may have an artifact, such as a flare (e.g., glare and/or starburst effect), due to at least some of the lines disposed in the UDC area and/or the light emitting unit disposed in the UDC area.

According to an embodiment, an electronic device may comprise a camera module including a first camera configured to obtain an image using light introduced through a first area of a display and a second camera configured to obtain an image using light introduced through a second area of the display, the display including the first area, the second area, and a third area other than the first area and the second area and at least one processor electrically connected with the display and the camera module. The first area may include a first light emitting unit and a first line connecting the first light emitting unit and a first light emitting circuit disposed in the third area, the first line being arranged in a first direction. The second area may include a second light emitting unit and a second line connecting the second light emitting unit and a second light emitting circuit disposed in the third area, the second line being arranged in a second direction different from the first direction.

According to an embodiment, an electronic device may comprise a display including a first area including a first light emitting unit connected with a first line arranged in a first direction and a second area including a second light emitting unit connected with a second line arranged in a second direction different from the first direction, a camera module including a first camera configured to obtain a first image using light introduced through the first area and a second camera configured to obtain a second image using light introduced through the second area, and at least one processor electrically connected with the display and the camera module. The at least one processor may be configured to obtain the first image through the first camera and the second image through the second camera, detect a first portion generated by the first line in the first image and a second portion generated by the second line in the second image, and obtain a third image by synthesizing the first image and the second image based on the first portion and the second portion.

According to an embodiment, an electronic device may comprise a first structure, a second structure configured to guide a slide of the first structure, a flexible display at least partially inserted into an inside of the second structure or visually exposed to an outside of the second structure as the first structure slides and including a plurality of areas each of which includes a plurality of slits arranged in different directions, a camera configured to obtain an image using light introduced through at least one of the plurality of areas, and at least one processor electrically connected with the flexible display and the camera. The at least one processor may be configured to obtain a plurality of images using the camera while the first structure slides with respect to the second structure, detect an artifact in each of the plurality of images, and obtain an image by synthesizing the plurality of images based on the artifact.

According to various embodiments, a method for providing an image and an electronic device supporting the same may implement a display to include a plurality of UDC areas where lines in different directions are disposed and obtain an image having minimized (or removed) artifacts, based on a plurality of images obtained using the light transmitted through the plurality of UDC areas by a camera.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the present disclosure will be more apparent from the following description taken in conjunction with the accompanying drawings.

DETAILED DESCRIPTION

Figure 1:
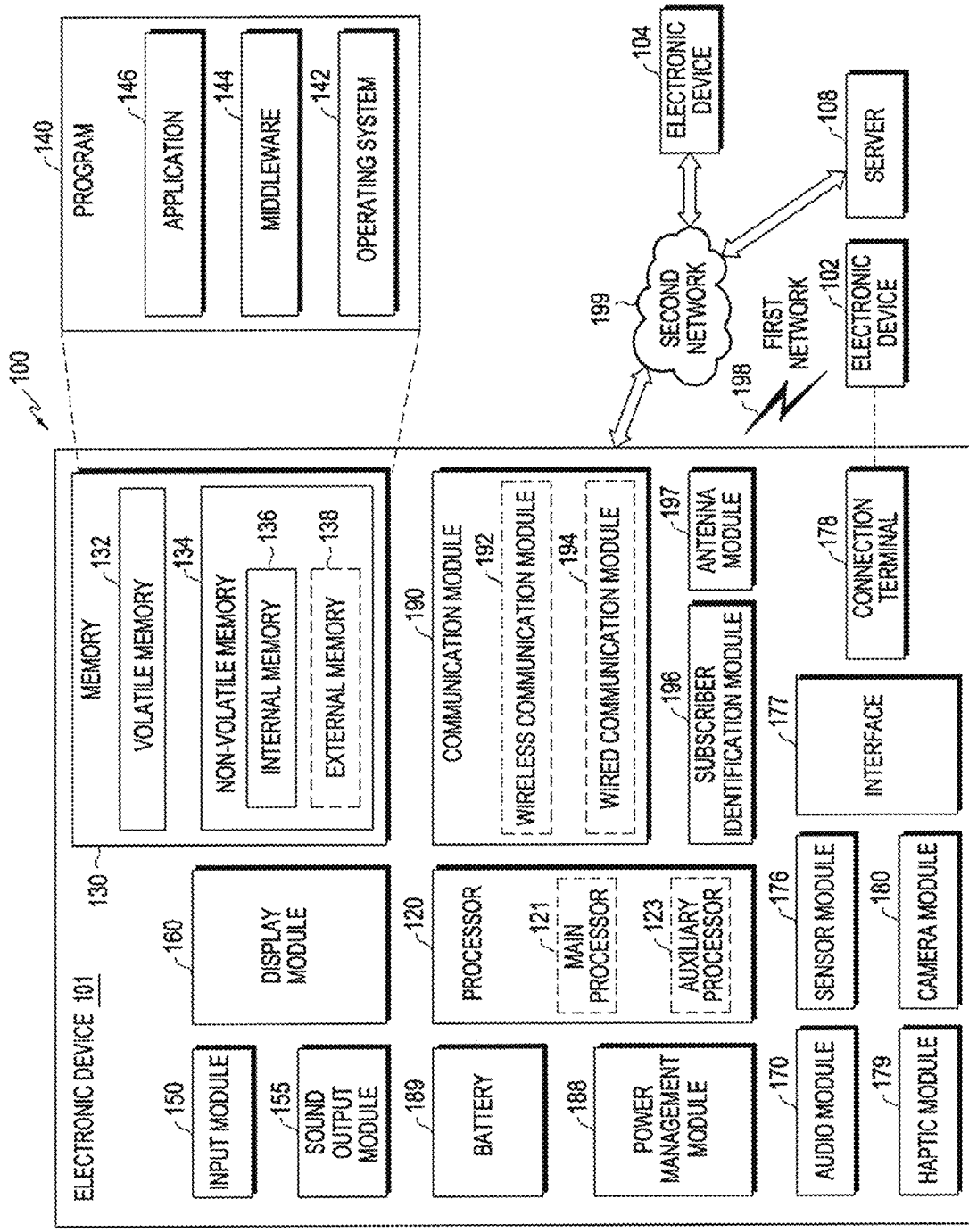
FIG. 1 is a view illustrating an electronic device in a network environment according to an embodiment.

FIG. 1 is a block diagram illustrating an electronic device 101 in a network environment 100 according to an embodiment.

Referring to FIG. 1, the electronic device 101 in the network environment 100 may communicate with at least one of an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
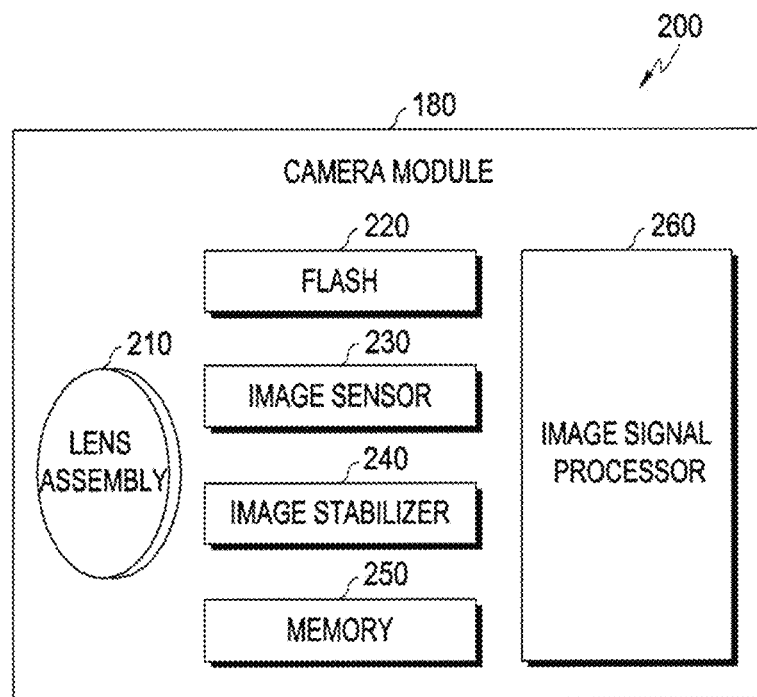
FIG. 2 is a block diagram illustrating a camera module according to an embodiment.

FIG. 2 is a block diagram 200 illustrating the camera module 180 according to various embodiments.

Referring to FIG. 2, the camera module 180 may include a lens assembly 210, a flash 220, an image sensor 230, an image stabilizer 240, memory 250 (e.g., buffer memory), or an image signal processor 260. In an embodiment, at least one of the components (e.g., the lens assembly 210, the flash 220, the image sensor 230, the image stabilizer 240, and the memory 250) included in the camera module 180 may be operated by the control of the control circuit (e.g., the processor 120 of FIG. 1) of the electronic device (e.g., electronic device 101 of FIG. 1). For example, the control circuit (e.g., the processor 120 of FIG. 1) may include a main processor (e.g., the main processor 121 of FIG. 1) and/or an auxiliary processor (e.g., the auxiliary processor 123 or image signal processor 260 of FIG. 1).

In an embodiment, the lens assembly 210 may collect light emitted or reflected from an object whose image is to be taken. The lens assembly 210 may include one or more lenses. According to an embodiment, the camera module 180 may include a plurality of lens assemblies 210. In such a case, the camera module 180 may form, for example, a dual camera, a 360-degree camera, or a spherical camera. Some of the plurality of lens assemblies 210 may have the same lens attribute (e.g., field of view, focal length, auto-focusing, f number, or optical zoom), or at least one lens assembly may have one or more lens attributes different from those of another lens assembly. The lens assembly 210 may include, for example, a wide-angle lens or a telephoto lens.

In an embodiment, the flash 220 may emit light that is used to reinforce light reflected from an object. According to an embodiment, the flash 220 may include one or more light emitting diodes (LEDs) (e.g., a red-green-blue (RGB) LED, a white LED, an infrared (IR) LED, or an ultraviolet (UV) LED) or a xenon lamp.

In an embodiment, the image sensor 230 may obtain an image corresponding to an object by converting light emitted or reflected from the object and transmitted via the lens assembly 210 into an electrical signal. According to an embodiment, the image sensor 230 may include one selected from image sensors having different attributes, such as a RGB sensor, a black-and-white (BW) sensor, an IR sensor, or a UV sensor, a plurality of image sensors having the same attribute, or a plurality of image sensors having different attributes. Each image sensor included in the image sensor 230 may be implemented using, for example, a charged coupled device (CCD) sensor or a complementary metal oxide semiconductor (CMOS) sensor.

In an embodiment, the image stabilizer 240 may move the image sensor 230 or at least one lens included in the lens assembly 210 in a particular direction, or control an operational attribute (e.g., adjust the read-out timing) of the image sensor 230 in response to the movement of the camera module 180 or the electronic device 101 including the camera module 180. This allows compensating for at least part of a negative effect (e.g., image blurring) by the movement on an image being captured. According to an embodiment, the image stabilizer 240 may sense such a movement by the camera module 180 or the electronic device 101 using a gyro sensor (not shown) or an acceleration sensor (not shown) disposed inside or outside the camera module 180. According to an embodiment, the image stabilizer 240 may be implemented, for example, as an optical image stabilizer.

In an embodiment, the memory 250 may store, at least temporarily, at least part of an image obtained via the image sensor 230 for a subsequent image processing task. For example, if image capturing is delayed due to shutter lag or multiple images are quickly captured, a raw image obtained (e.g., a Bayer-patterned image, a high-resolution image) may be stored in the memory 250, and its corresponding copy image (e.g., a low-resolution image) may be previewed via the display module 160. Thereafter, if a specified condition is met (e.g., by a user's input or system command), at least part of the raw image stored in the memory 250 may be obtained and processed, for example, by the image signal processor 260. According to an embodiment, the memory 250 may be configured as at least part of the memory 130 or as a separate memory that is operated independently from the memory 130.

In an embodiment, the image signal processor 260 may perform one or more image processing with respect to an image obtained via the image sensor 230 or an image stored in the memory 250. The one or more image processing may include, for example, depth map generation, three-dimensional (3D) modeling, panorama generation, feature point extraction, image synthesizing, or image compensation (e.g., noise reduction, resolution adjustment, brightness adjustment, blurring, sharpening, or softening). Additionally or alternatively, the image signal processor 260 may perform control (e.g., exposure time control or read-out timing control) with respect to at least one (e.g., the image sensor 230) of the components included in the camera module 180. An image processed by the image signal processor 260 may be stored back in the memory 250 for further processing, or may be provided to an external component (e.g., the memory 130, the display module 160, the electronic device 102, the electronic device 104, or the server 108) outside the camera module 180.

According to an embodiment, the image signal processor 260 may be configured as at least part of the processor 120, or as a separate processor that is operated independently from the processor 120. If the image signal processor 260 is configured as a separate processor from the processor 120, at least one image processed by the image signal processor 260 may be displayed, by the processor 120, via the display module 160 as it is or after being further processed.

According to an embodiment, the electronic device 101 may include a plurality of camera modules 180 having different attributes or functions. For example, there may be configured a plurality of camera modules 180 including lenses (e.g., the lens assembly 210) having different angles of view, and the electronic device 101 may control to use the angle of view of the camera module 180 related to the user's selection based on the user's selection. At least one of the plurality of camera modules 180 may form, for example, a wide-angle camera and at least another of the plurality of camera modules may form a telephoto camera. Similarly, at least one of the plurality of camera modules 180 may form, for example, a front camera and at least another of the plurality of camera modules 180 may form a rear camera. Further, the plurality of camera modules 180 may include at least one of a wide-angle camera, a telephoto camera, a color camera, a monochrome camera, or an infrared (IR) camera (e.g., a time of flight (TOF) camera or a structured light camera). According to an embodiment, the IR camera may be operated as at least a portion of a sensor module (e.g., the sensor module 176 of FIG. 1). For example, the TOF camera may be operated as at least a portion of a sensor module (e.g., the sensor module 176 of FIG. 1) for detecting a distance from the subject.

Figure 3:
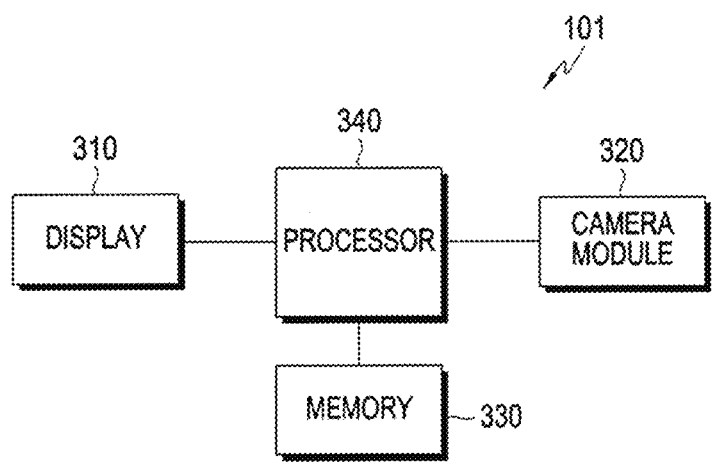
FIG. 3 is a block diagram illustrating an electronic device according to an embodiment.

FIG. 3 is a block diagram illustrating an electronic device 101 according to an embodiment.

Referring to FIG. 3, in an embodiment, the electronic device 101 may include display 310, a camera module 320, a memory 330, and/or a processor 340.

In an embodiment, the display 310 may be the display module 160 of FIG. 1.

In an embodiment, the display 310 may include a plurality of areas for the electronic device 101 to be implemented by an under display camera (UDC) technology.

In an embodiment, the display 310 may include a plurality of areas (hereinafter, referred to as a "plurality of UDC areas") through which light from the outside passes so that light from the outside is introduced into the camera module 320 to obtain an image. In an embodiment, the respective positions of the plurality of UDC areas may correspond to the positions where the plurality of cameras are respectively disposed. For example, when the electronic device 101 includes a plurality of UDC areas and a plurality of cameras, the position of a first UDC area in the plurality of UDC areas may correspond to the position where a first camera in the plurality of cameras is disposed, and a second UDC area in the plurality of UDC areas may correspond to the position where a second camera in the plurality of cameras is disposed.

In an embodiment, the plurality of UDC areas may be activated or deactivated based on whether a camera-related application is executed. For example, when the camera-related application is executed on the electronic device 101, the plurality of UDC areas (e.g., a plurality of pixels (e.g., RGB pixels) in each of the plurality of UDC areas) may be turned off by the control of the processor 340. As another example, when an application for displaying screen is executed on the electronic device 101, the plurality of UDC areas, along with the area other than the plurality of UDC areas in the display 310 (hereinafter referred to as a "non-under display camera (UDC) area"), may be turned on by the control of the processor 340 to display the screen.

In an embodiment, to increase the light transmittance of the display 310, the display 310 may be implemented in such a manner in which a light emitting unit (e.g., RGB pixels) may be disposed in each of the plurality of UDC areas, and a circuit (e.g., transistor) connected with the light emitting unit (hereinafter, referred to as a "light emitting circuit") via a line to transfer data signals (e.g., data voltage and/or data current) to the light emitting unit is disposed in the non-UDC area.

The structure of the display 310 is described in greater detail with reference to FIG. 4.

Figure 4:
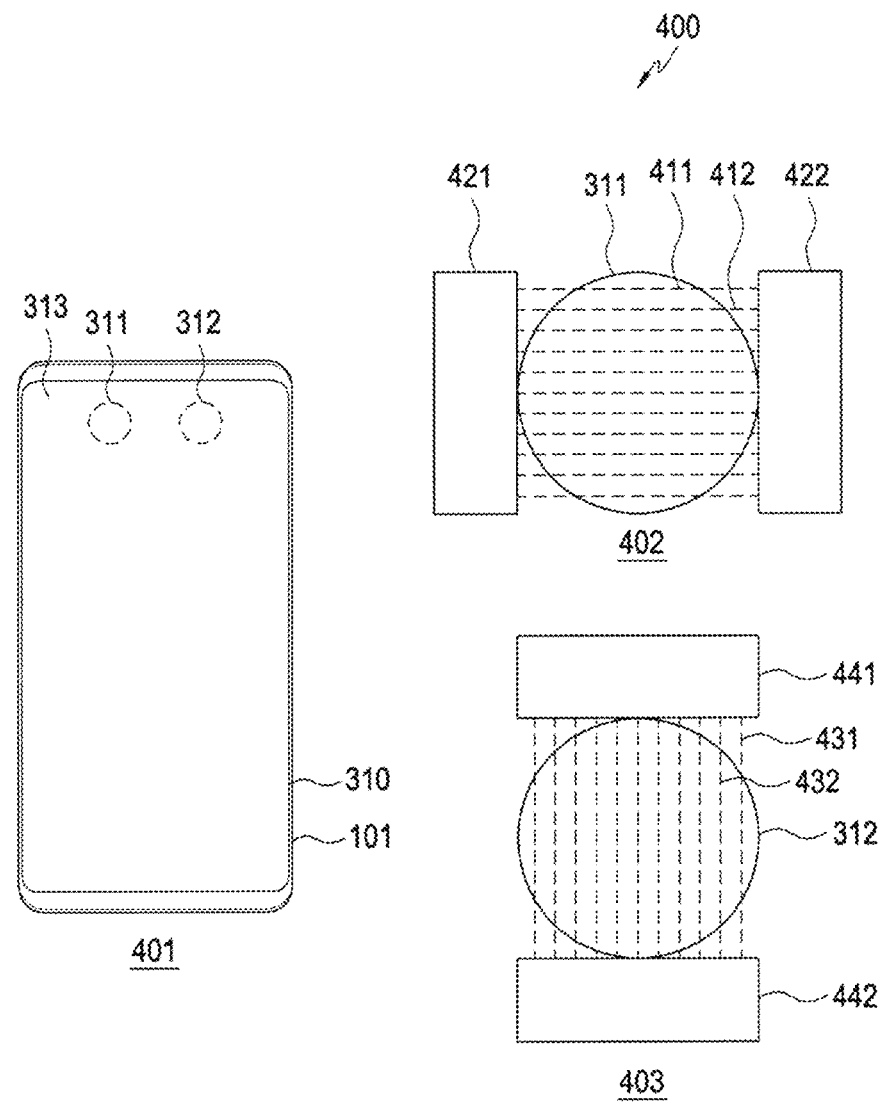
FIG. 4 is a view illustrating a display according to an embodiment.

FIG. 4 is a view 400 illustrating a display 310 according to an embodiment.

Referring to FIG. 4, in an embodiment, as shown as reference number 401, the display 310 may include a first UDC area 311, a second UDC area 312, and a non-UDC area 313. Although reference number 401 exemplifies that the first UDC area 311 and the second UDC area 312 are implemented in circular shapes, embodiments are not limited thereto. For example, the first UDC area and the second UDC area may be implemented in various shapes (e.g., a rectangular shape). Further, although reference number 401 exemplifies that the display 301 includes two UDC areas, such as the first UDC area 311 and the second UDC area 312, embodiments are not limited thereto. For example, the display 310 may include three or more UDC areas.

In an embodiment, each of the plurality of UDC areas may include a light emitting unit connected with the light emitting circuit via lines and at least some of the lines.

In an embodiment, the light emitting unit may include pixels made of light emitting elements (e.g., organic electro luminescence (EL) elements). In an embodiment, the organic EL elements may emit light when holes and electrons are injected thereto from the anode and the cathode.

In an embodiment, the line connecting the light emitting unit and the light emitting circuit (hereinafter, referred to as a "line") may transfer data signals (e.g., data voltage and/or data current) from the light emitting circuit disposed in the non-UDC area (e.g., the non-UDC area 313) to the light emitting unit disposed in the UDC area.

In an embodiment, the line connecting the light emitting unit and the light emitting circuit may be a transparent line (e.g., line made of a transparent material). However, without limited thereto, the line connecting the light emitting unit and the light emitting circuit may be an opaque line, e.g., made of metal.

In an embodiment, in each of the plurality of UDC areas, the direction in which line connecting the light emitting unit and the light emitting circuit is placed may differ. For example, as shown as reference number 402 and reference number 403, the direction in which the plurality of lines 411 and 412 (hereinafter, referred to as 'first lines') connecting the light emitting unit (not shown) and the light emitting circuits 421 and 422 are arranged in the first UDC area 311 may differ from the direction in which the plurality of lines (hereinafter, referred to as "second lines") connecting the light emitting unit (not shown) and the light emitting circuits 441 and 442 are arranged in the second UDC area 312. Although reference number 402 and reference number 403 exemplify that the first lines 411 and 412 are arranged in the horizontal direction (left/right direction), and the second lines 431 and 432 are arranged in the vertical direction (upper/lower direction), but embodiments are not limited thereto.

Figure 5:
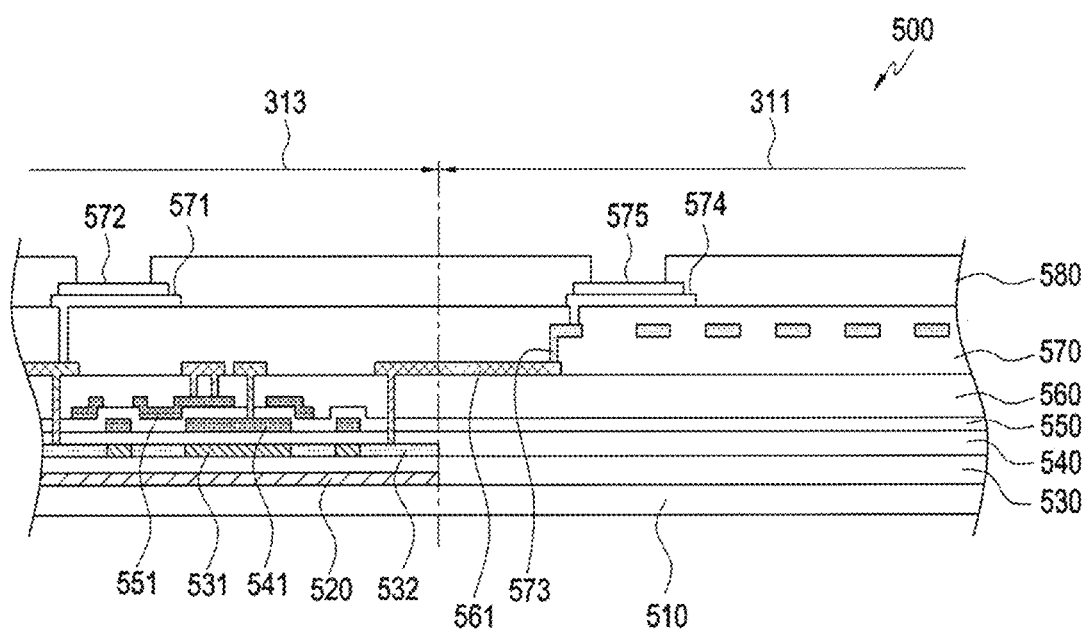
FIG. 5 is a cross-sectional view illustrating a display according to an embodiment.

FIG. 5 is a cross-sectional view 500 illustrating a display according to an embodiment.

In an embodiment, FIG. 5 may illustrate a cross section (e.g., side surface) of a portion of the first UDC area 311 and a portion of the non-UDC area 313 of FIG. 4. In an embodiment, although not shown, the cross section of a portion of the second UDC area 312 and a portion of the non-UDC area 313 may be at least partially similar to that of FIG. 5.

In an embodiment, a lower substrate 510 may form a lowest layer of the non-UDC area 313 and the first UDC area 311. The lower substrate 510 may be made of glass or polyimide (PI).

In an embodiment, a light blocking layer 520 may be formed on the lower substrate 510. The light blocking layer 520 may be formed in at least a portion of the non-UDC area 313.

In an embodiment, a buffer layer 530 may cover the upper surfaces of the lower substrate 510 and the light blocking layer 520. The buffer layer 530 may protect the non-UDC area 313 and the first UDC area 311 from impact.

In an embodiment, a first active layer 531 may form a low temperature polycrystalline silicon (LTPS) thin film transistor (TFT). For example, the first active layer 531 may be implemented in the form of a low-temperature polycrystalline oxide (LTPO) transistor, a hybrid oxide and polycrystalline silicon (HOP) transistor, or an oxide transistor.

In an embodiment, a second active layer 532 may transfer a data voltage.

In an embodiment, a first gate insulation film 540 may electrically isolate the upper and lower layers.

In an embodiment, a first metal layer 541 may form the gate of the transistor.

In an embodiment, a second gate insulation film 550 may electrically isolate the upper and lower layers.

In an embodiment, the second metal layer 551 may form the source electrode and the drain electrode of the transistor.

In an embodiment, an intermediate insulation film 560 may electrically isolate the upper and lower layers.

In an embodiment, a data line 561 may be connected to the second active layer 532. The data line 561 may transfer a data signal (e.g., data voltage or data current) from the transistor of the non-UDC area 313 to the light emitting unit of the first UDC area 311.

In an embodiment, a protection layer 570 may protect the data line 561.

In an embodiment, the first anode 571 and the first light emitting layer 572 may form a light emitting unit of the non-UDC area 313.

In an embodiment, a transparent electrode 573 may be included in the protection layer 570. For example, the transparent electrode 573 may be disposed in the protection layer 570. The transparent electrode 573 may be connected to the data line 561. The transparent electrode 573 may transfer a data voltage. The transparent electrode 573 may be formed in the first UDC area 311.

In an embodiment, the second anode 574 and the second light emitting layer 575 may form a light emitting unit of the UDC area 311. The second anode 574 and the second light emitting layer 575 may form a pixel that receives a driving voltage from a driving transistor disposed in the non-UDC area 313.

In an embodiment, the second anode 574 may be connected to the transparent electrode 573. The second anode 574 may form a light emitting unit (e.g., the first light emitting unit 615 and the second light emitting unit 645 of FIG. 6B) of the first UDC area 311. The second anode 574 may receive a data voltage from the transparent electrode 573.

In an embodiment, an encapsulation layer 580 may cover the first anode 571, the protection layer 570 including the transparent electrode 573, and the second anode 574. The encapsulation layer 580 may expose at least a portion of the first light emitting layer 572 and the second light emitting layer 575.

In an embodiment, when the distance from the non-UDC area 313 to the first UDC area 311 is shorter than a designated distance, the data line 561 and the second anode 574 may be connected by the transparent electrode 573.

In an embodiment, the data line 561 and/or the transparent electrode 573 may correspond to a first line (e.g., the first lines 411 and 412 of FIG. 4).

In an embodiment, when the camera obtains an image using the light introduced through the UDC area (e.g., the area in which the light emitting unit and the line are not disposed in the UDC area), an artifact may occur in the obtained image.

The artifact generated in the image due to the components included in the UDC area is described below with reference to FIGS. 6A and 6B.

Figure 6A:
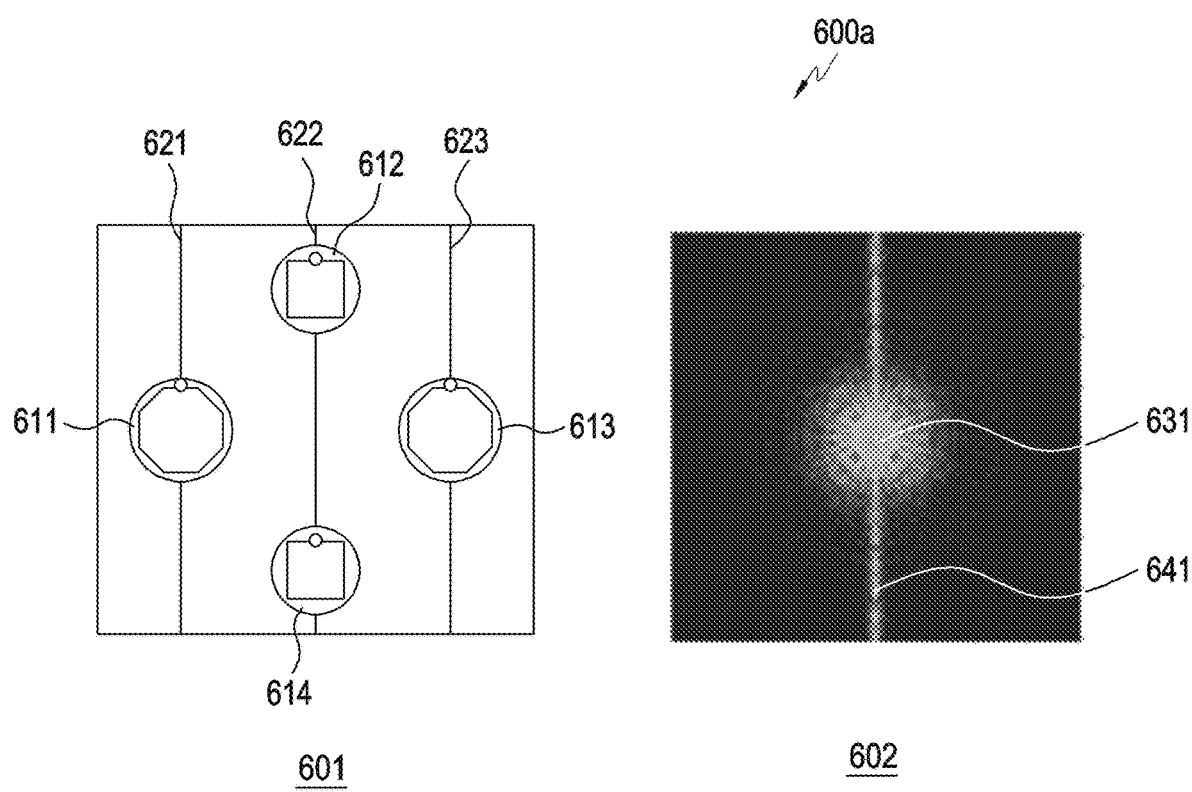
FIG. 6A is a view illustrating an artifact generated by components included in a UDC area according to an embodiment.

FIG. 6A is a view 600a illustrating an artifact generated by components included in a UDC area according to an embodiment.

Referring to FIG. 6A, in an embodiment, reference numeral 601 may show components included in the UDC area. For example, as shown as reference numeral 601, some of a plurality of pixels (e.g., plurality of RGB pixels) 611, 612, 613, and 614 and a plurality of lines 621, 622, and 623 may be included in the UDC area.

In an embodiment, an artifact may be generated in the image obtained by the camera, due to some of the plurality of pixels 611, 612, 613, and 614 and the plurality of lines 621, 622, and 623 included in the UDC area. For example, reference numeral 602 may show a flare (e.g., glare) 631 generated by one pixel (e.g., the anode of the pixel) in the plurality of pixels included in the UDC area in the image and a flare 641 generated by the line (e.g., a transparent line) connected to the pixel.

In an embodiment, the flare generated by the line may be generated along the direction in which the line is disposed. For example, as shown as reference numeral 602, when the line is disposed in the vertical direction, the flare generated by the line may also be generated in the vertical direction.

Figure 6B:
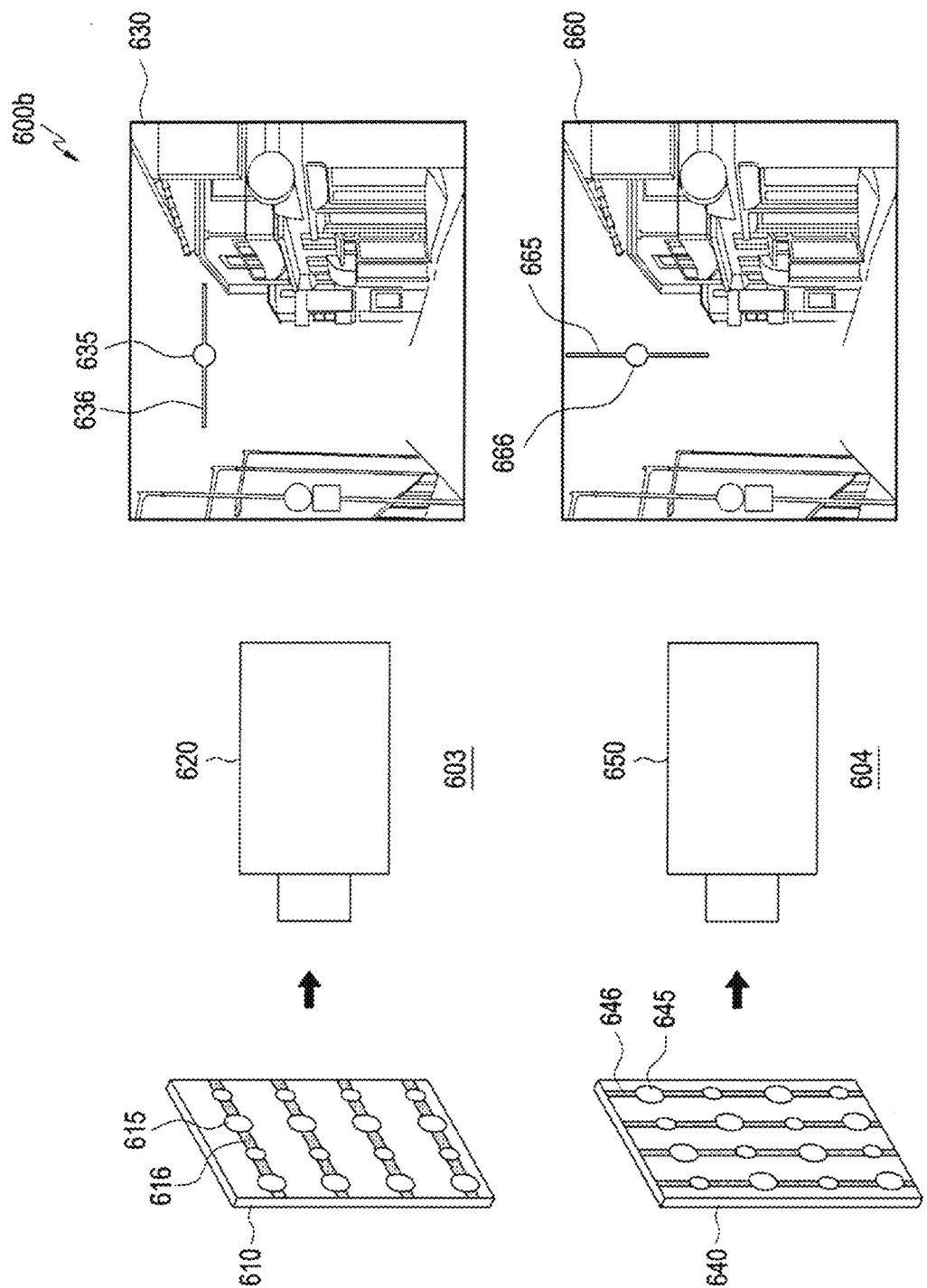
FIG. 6B is a view illustrating an artifact generated by components included in a UDC area according to an embodiment.

FIG. 6B is a view 600b illustrating an artifact generated by components included in a UDC area according to an embodiment.

Referring to FIG. 6B, in an embodiment, the electronic device 101 may include a display 310 including a first UDC area 610 and a second UDC area 640, a first camera 620 corresponding to the first UDC area (e.g., the first camera disposed in the position corresponding to the position of the first UDC area), and a second camera 650 corresponding to the second UDC area (e.g., the second camera disposed in the position corresponding to the position of the second UDC area). In an embodiment, in reference number 603, the first camera 620 may obtain a first image 630 using the light introduced through the first UDC area including the first light emitting unit 615 and the first line 616 disposed in the first direction (e.g., horizontal direction). In an embodiment, in reference number 604, the second camera 650 may obtain a second image 660 using the light introduced through the second UDC area including the second light emitting unit 645 and the second line 646 disposed in the second direction (e.g., vertical direction) different from the first direction.

In an embodiment, a flare may be generated due to the first line 616 and the second line 646 in the first image 630 and the second image 660, respectively. For example, a flare 636 may be generated in the direction corresponding to the first direction in which the first line is disposed, from the image portion 635 of the light source (e.g., the sun), in the first image 630. A flare 665 may be generated in the direction corresponding to the second direction in which the second line is disposed, from the image portion 666 of the light source (e.g., the sun), in the second image 660.

A method for correcting (e.g., minimizing, removing, or compensating for) the artifact (e.g., flare) generated by the light emitting unit and/or line included in the UDC area is described with reference to FIG. 7 and its subsequent figures.

Referring to FIG. 3, in an embodiment, the pixels per inch (PPI) (e.g., the number of pixels per unit area) of the UDC area may be lower than the PPI of the non-UDC area. However, without limited thereto, the PPI of the UDC area may be the same as the PPI of the non-UDC area.

In an embodiment, the camera module 320 may be the camera module 180 of FIGS. 1 and 2.

In an embodiment, the camera module 320 may include a plurality of cameras. For example, when the display 310 is implemented to including a first UDC area and a second UDC area, the camera module 320 may include a first camera (e.g., a first camera obtaining an image using the light passing through the first UDC area) disposed in the position corresponding to the position of the first UDC area and a second camera (e.g., a second camera obtaining an image using the light passing through the second UDC area) disposed in the position corresponding to the position of the second UDC area.

In an embodiment, the plurality of cameras included in the camera module 320 may be disposed on the rear surface of the display 310, i.e., behind the display 310, so as to be not visually exposed.

According to an embodiment, the memory 330 may be the memory 130 of FIG. 1.

In an embodiment, the memory 330 may store various information for performing an operation for providing an image. Various information stored in order for the memory 330 to provide an image is described below.

According to an embodiment, the processor 340 may be the processor 120 of FIG. 1.

According to an embodiment, the processor 340 may overall control the operation of providing an image. In an embodiment, the processor 340 may include one or more processors for performing the operation of providing an image.

In an embodiment, the processor 340 may include a plurality of components for performing the operation of providing an image. The plurality of components included in the processor 340 are described with reference to FIGS. 7, 8A, and 8B.

Although FIG. 3 illustrates an example in which the electronic device 101 includes the display 310, the camera module 320, the memory 330, and/or the processor 340 in an embodiment, it is not limited thereto. As an example, the electronic device 101 may further include at least one component among the components of the electronic device 101 illustrated in FIG. 1.

In an embodiment, the display 310 included in the electronic device 101 may be a flexible display. When the electronic device 101 includes a flexible display, the camera module 320 may include one camera. The one camera may obtain a plurality of images through a plurality of UDC areas included in the flexible display while the flexible display slides. In this case, the processor 340 may obtain an artifact-corrected image based on the plurality of images. The operation of providing an image, performed by the electronic device 101 including the flexible display, is described below with reference to FIGS. 11 to 15.

Figure 7:
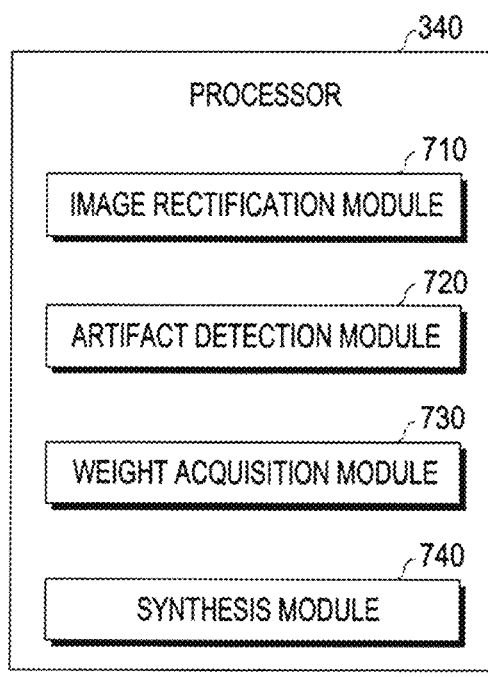
FIG. 7 is a block diagram illustrating a processor according to an embodiment.

FIG. 7 is a block diagram illustrating a processor 340 according to an embodiment.

Figure 8A:
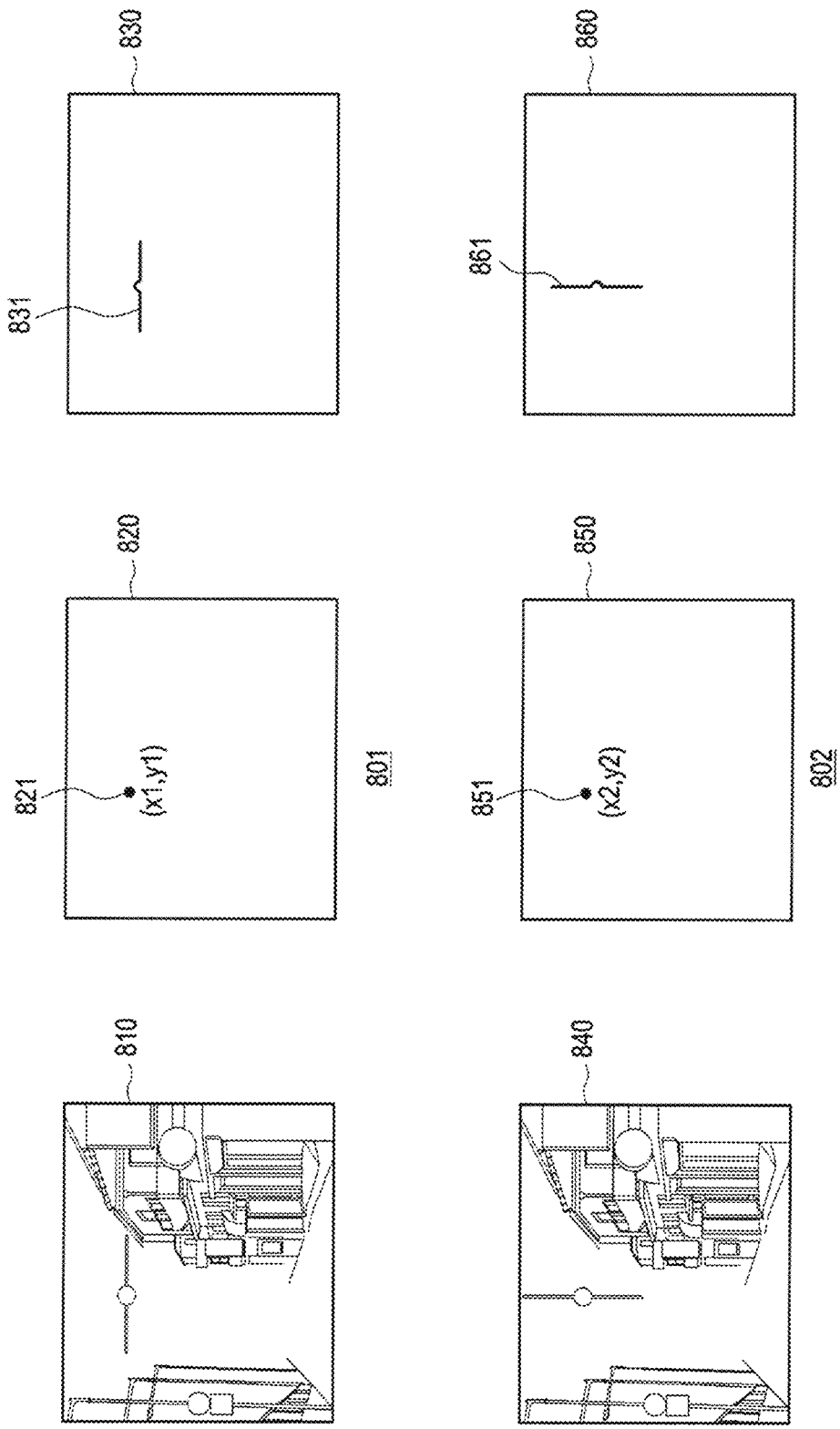
FIGS. 8A and 8B are views illustrating an example of a method for providing an image according to an embodiment.
Figure 8B:
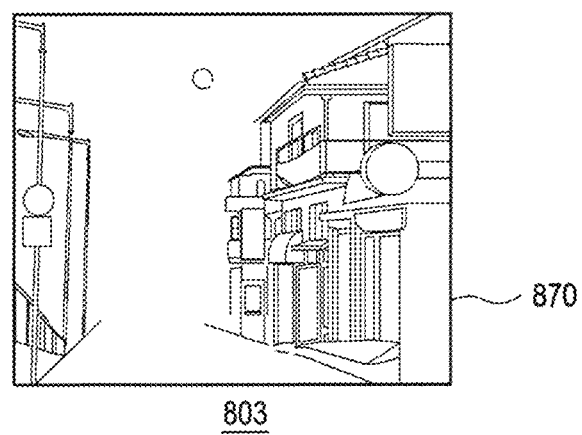

FIGS. 8A and 8B are views illustrating an example of a method for providing an image according to an embodiment.

Referring to FIGS. 7, 8A, and 8B, in an embodiment, the processor 340 may include an image rectification module 710, an artifact detection module 720, a weight acquisition module 730, and/or a synthesis module 740. For convenience of description, it is assumed below that the display 310 includes a first UDC area including a first light emitting unit connected with a first line arranged in a first direction (e.g., horizontal direction or left/right direction) and a second UDC area including a second light emitting unit arranged in a second line arranged in a direction (e.g., vertical direction or upper/lower direction) different from the first direction, and the camera module 320 includes a first camera disposed in the position corresponding to the position of the first UDC area and a second camera disposed in the position corresponding to the position of the second UDC area.

In an embodiment, the processor 340 may obtain a first image through the first camera and a second image through the second camera. For example, as shown in reference number 801 and reference number 802 of FIG. 8A, the processor 340 may obtain the first image 810 through the first camera and the second image 840 through the second camera.

In an embodiment, the image rectification module 710 may perform rectification on the first image obtained through the first camera and the second image obtained through the second camera. For example, the image rectification module 710 may map (e.g., align) the first image and the second image to the same coordinate system (e.g., common image plane).

In an embodiment, the artifact detection module 720 may detect an artifact (e.g., flare) in the first image (e.g., the first image on which rectification has been performed) and the second image (e.g., the second image on which rectification has been performed).

In an embodiment, the artifact detection module 720 may detect a plurality of pixels having pixel values greater than or equal to a threshold pixel value in the first image, as a first artifact, and a plurality of pixels having pixel values greater than or equal to the threshold pixel value in the second image, as a second artifact.

In an embodiment, the artifact detection module 720 may detect the center position of the first artifact in the first image and the center position of the second artifact in the second image. For example, the artifact detection module 720 may detect the center position of the first artifact, where a designated number of, or more, pixels having pixel values greater than or equal to the threshold pixel value are distributed in the first image and the center position of the second artifact where a designated number of, or more, pixels having pixel values greater than or equal to the threshold pixel value are distributed in the second image. For example, the artifact detection module 720 may detect the center position 821 (e.g., (x1, y1)) of the first artifact in the image 820 (e.g., the first image 810) and the center position 851 (e.g., (x2, y2)) of the second artifact in the image 850 (e.g., the second image 840).

In an embodiment, the artifact detection module 720 may detect the first artifact which occurs in the first direction (e.g., the first direction where the first line is arranged) with respect to the center position 821 of the first artifact and detect the second artifact which occurs in the second direction (e.g., the second direction where the second line is arranged) with respect to the center position 851 of the second artifact. For example, the artifact detection module 720 may detect the first artifact occurring in the first direction with respect to the center position 821 of the first artifact, based on the direction information (e.g., information about the first direction) about the first line arranged in the first UDC area stored in the memory 330. The artifact detection module 720 may detect the second artifact occurring in the second direction with respect to the center position 851 of the second artifact, based on the direction information (e.g., information about the second direction) about the second line arranged in the second UDC area stored in the memory 330.

In an embodiment, the weight acquisition module 730 may obtain the respective weights for the pixels of the first image and the pixels of the second image.

In an embodiment, the weight acquisition module 730 may align the first image and the second image based on the center position 821 of the first artifact and the center position 851 of the second artifact. For example, the weight acquisition module 730 may align the first image and the second image so that the center position 821 of the first artifact and the center position 851 of the second artifact coincide with each other in the coordinate system.

In an embodiment, the weight acquisition module 730 may generate a weight map. For example, the weight acquisition module 730 may obtain an image (hereinafter, referred to as a "first subtracted image") by subtracting the second image (e.g., the values of the pixels of the aligned second image) from the first image (e.g., the values of the pixels of the aligned first image), at the positions of corresponding a plurality of pixels in the first and second images. The weight acquisition module 730 may generate a first weight map including pixels having pixel values greater than or equal to a designated pixel value (e.g., positive pixel value) in the first subtracted image. The weight acquisition module 730 may obtain an image (hereinafter, referred to as a "second subtracted image") by subtracting the first image (e.g., the values of the pixels of the aligned function image) from the second image (e.g., the values of the pixels of the aligned second image), at the positions of corresponding a plurality of pixels in the first and second images. The weight acquisition module 730 may generate a second weight map including pixels having pixel values greater than or equal to a designated pixel value (e.g., positive pixel value) in the second subtracted image.

In an embodiment, as shown as reference number 801 and reference number 802, the weight acquisition module 730 may obtain a first weight map 830 including the pixels 831 that have pixel values greater than or equal to the designated pixel value in the first subtracted image and a second weight map 860 including the pixels 861 that have pixel values greater than or equal to the designated pixel value in the second subtracted image. In an embodiment, the pixels 831 included in the first weight map 830 may have pixel values larger than the pixel values of other pixels in the first image as the first artifact is generated by the first line (and/or first light emitting unit). In an embodiment, the pixels 861 included in the second weight map 860 may have pixel values larger than the pixel values of other pixels in the second image as the second artifact is generated by the second line (and/or second light emitting unit).

In an embodiment, the synthesis module 740 may synthesize the first image and the second image based on the first weight map 830 and the second weight map 860. For example, the synthesis module 740 may synthesize the first image and the second image by assigning a lower weight to the pixels (e.g., the pixels 831 included in the first weight map 830 and the pixels 861 included in the second weight map 860) where the first artifact and the second artifact have occurred in the first image and the second image, than the weights assigned to other pixels (e.g., the pixels other than the pixels where the first artifact and the second artifact occur in the first image and the second image).

In an embodiment, the synthesis module 740 may synthesize a plurality of images including the first image and the second image based on Equation 1 and Equation 2 below.

$$I_{i,j}^{out} = \sum_{k \in N} I_{i,j}^k W_{i,j}^k \qquad \text{[Equation 1]}$$

$$\sum_{k \in N} W_{i,j}^k = 1 \qquad \text{[Equation 2]}$$

In an embodiment, in Equation 1, $I_{i,j}^{out}$ may denote the value of the pixel at the (i, j) position (e.g., the position of the pixel in the ith row and the jth column in the synthesized image) of the synthesized image of the first image and the second image. In Equation 1, $I_{i,j}^k$ may denote the value of the pixel at the (i, j) position of the kth image in the plurality of images obtained through the plurality of cameras. In Equation 1 and Equation 2, $W_{i,j}^k$ may denote the weight of the pixel at the (i, j) position of the kth image in the plurality of images obtained through the plurality of cameras.

In an embodiment, as the synthesis module 740 assigns a lower weight to the pixels where a plurality of artifacts occur in a plurality of images including the first image and the second image than the weights assigned to other pixels, it is possible to remove the artifacts from the synthesized image of the first image and the second image. For example, as shown as reference number 803, by the above-described operations, it is possible to obtain the synthesized image 870 of the first image and the second image, where the first artifact generated in the first image and the second artifact generated in the second image have been removed.

Although not shown in FIG. 7, in an embodiment, the processor 340 may further include a restoration module. The restoration module may restore (or compensate for) the signal component attenuated while synthesizing the first image and the second image.

In an embodiment, when no artifact is detected in the first image and the second image by the artifact detection module 720, the operation of synthesizing the first image and second image may be performed by the synthesis module 740.

According to an embodiment, an electronic device 101 may comprise a camera module 320 including a first camera configured to obtain an image using light introduced through a first area of a display 310 and a second camera configured to obtain an image using light introduced through a second area of the display, the display 310 including the first area, the second area, and a third area other than the first area and the second area in the display 310 and at least one processor 340 electrically connected with the display and the camera module. The first area may include a first light emitting unit and a first line connecting the first light emitting unit and a first light emitting circuit disposed in the third area, the first line being arranged in a first direction. The second area may include a second light emitting unit and a second line connecting the second light emitting unit and a second light emitting circuit disposed in the third area, the second line being arranged in a second direction different from the first direction.

According to an embodiment, the first line and the second line may be transparent lines.

According to an embodiment, the first light emitting circuit may be configured to transfer a data signal to the first light emitting unit through the first line, and the second light emitting circuit may be configured to transfer a data signal to the second light emitting unit through the second line.

According to an embodiment, pixels per inch (PPI) of the first area and PPI of the second area may be lower than PPI of the third area.

According to an embodiment, the first direction may be a left or right direction, and the second direction may be a vertical direction.

According to an embodiment, the first camera may be disposed under the first area, and the second camera may be disposed under the second area.

According to an embodiment, an electronic device 101 may comprise a display 310 including a first area including a first light emitting unit connected with a first line arranged in a first direction and a second area including a second light emitting unit connected with a second line arranged in a second direction different from the first direction, a camera module 320 including a first camera configured to obtain a first image using light introduced through the first area and a second camera configured to obtain a second image using light introduced through the second area, and at least one processor 340 electrically connected with the display and the camera module. The at least one processor 340 may be configured to obtain the first image through the first camera and the second image through the second camera, detect a first portion generated by the first line in the first image and a second portion generated by the second line in the second image, and obtain a third image by synthesizing the first image and the second image based on the first portion and the second portion.

According to an embodiment, the at least one processor may be configured to detect, as the first portion, a plurality of pixels having pixel values greater than or equal to a threshold pixel value in the first image, and detect, as the second portion, a plurality of pixels having pixel values greater than or equal to the threshold pixel value in the second image.

According to an embodiment, the at least one processor may be configured to detect a center position of the first portion in the first image, wherein a number of pixels having pixel values greater than or equal to a threshold pixel value and distributed in the first portion is greater than or equal to a designated number, detect a center position of the second portion in the second image, wherein a number of pixels having pixel values greater than or equal to the threshold pixel value and distributed in the second portion is greater than or equal to the designated number, detect the first portion generated in the first direction with respect to the center position of the first portion, and detect the second portion generated in the second direction with respect to the center position of the second portion.

According to an embodiment, the at least one processor may be configured to obtain e weights for each of pixels of the first image and for each of pixels of the second image and obtain the third image by synthesizing the first image and the second image, based on the weights.

According to an embodiment, the at least one processor may be configured to align the first image and the second image based on the center position of the first portion and the center position of the second portion, generate a first weight map including pixels corresponding to the first portion by subtracting the aligned second image from the aligned first image, for each of positions of corresponding pixels, and generate a second weight map including pixels corresponding to the second portion by subtracting the aligned first image from the aligned second image, for each of positions of corresponding pixels.

According to an embodiment, the at least one processor may be configured to synthesize the first image and the second image by assigning lower weights to pixels included in the first weight map and pixels included in the second weight map than weights assigned to remaining pixels of the first image and the second image.

According to an embodiment, the first line and the second line may be transparent lines.

According to an embodiment, the first line may be configured to connect the first light emitting unit with a first light emitting circuit disposed in a third area other than the first area and the second area in the display. The second line may be configured to connect the second light emitting unit with a second light emitting circuit disposed in the third area.

According to an embodiment, the first light emitting circuit may be configured to transfer a data signal to the first light emitting unit through the first line, and the second light emitting circuit may be configured to transfer a data signal to the second light emitting unit through the second line.

According to an embodiment, pixels per inch (PPI) of the first area and PPI of the second area may be lower than PPI of the third area.

According to an embodiment, the first portion and second portion may include flares.

According to an embodiment, the first portion may be generated as light introduced through the first area is diffracted by the first line. The second portion may be generated as light introduced through the second area is diffracted by the first line.

Figure 9:
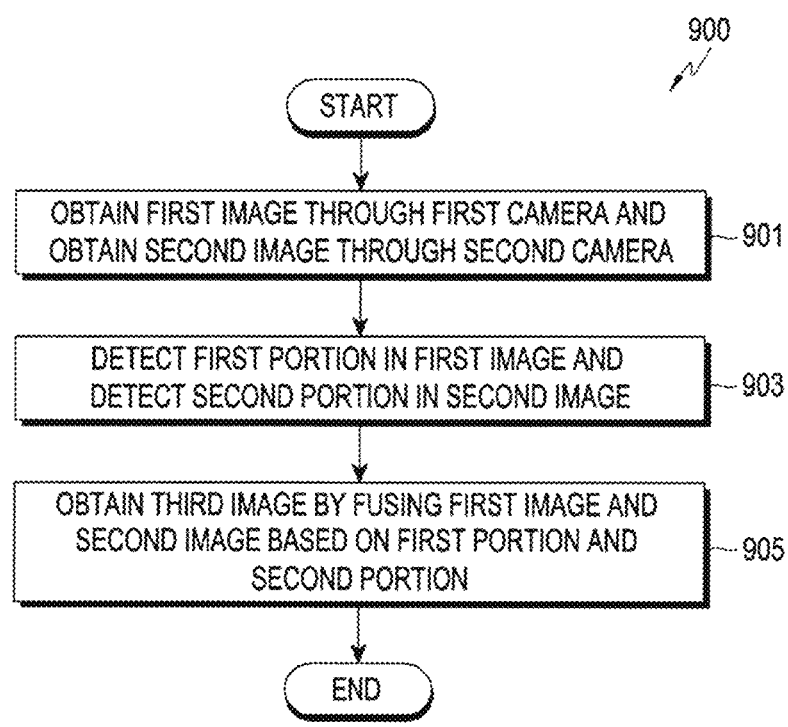
FIG. 9 is a flowchart illustrating a method for providing an image according to an embodiment.

FIG. 9 is a flowchart 900 illustrating a method for providing an image according to an embodiment.

Referring to FIG. 9, in operation 901, in an embodiment, the processor 340 may obtain a first image through a first camera and a second image through a second camera of a plurality of cameras (e.g., the camera module 320).

In an embodiment, the display 310 may include a first UDC area including a first light emitting unit connected with a first line arranged in a first direction (e.g., horizontal direction or left/right direction), a second UDC area including a second light emitting unit connected with a second line arranged in a direction (e.g., vertical direction or upper/lower direction) different from the first direction, and a non-UDC area including a first light emitting circuit connected with the first light emitting unit through the first line and a second light emitting circuit connected with the second light emitting unit through the second line. When a camera-related application is executed, the processor 340 may turn off the first light emitting unit and the second light emitting unit and obtain a first image through the first camera and second image through the second camera.

In operation 903, in an embodiment, the processor 340 may detect a first portion generated by the first line in the first image (e.g., first artifact or first flare generated as the light introduced through the first UDC area is diffracted by the first line). Hereinafter, "first portion" and "first artifact" are interchangeably used. The processor 340 may also detect a second portion generated by the second line in the second image (e.g., second artifact or second flare generated as the light introduced through the second UDC area is diffracted by the second line). Hereinafter, "second portion" and "second artifact" are interchangeably used.

In an embodiment, the processor 340 may detect a plurality of pixels having pixel values greater than or equal to a threshold pixel value in the first image, as the first artifact, and a plurality of pixels having pixel values greater than or equal to the threshold pixel value in the second image, as the second artifact.

In an embodiment, the processor 340 may detect the center position of the first artifact in the first image and the center position of the second artifact in the second image. For example, the processor 340 may detect the center position of the first artifact, where a designated number of, or more, pixels having pixel values greater than or equal to the threshold pixel value are distributed in the first image and the center position of the second artifact where a designated number of, or more, pixels having pixel values greater than or equal to the threshold pixel value are distributed in the second image.

In an embodiment, the processor 340 may detect the first artifact which occurs in the first direction (e.g., the first direction where the first line is arranged) with respect to the center position of the first artifact and detect the second artifact which occurs in the second direction (e.g., the second direction where the second line is arranged) with respect to the center position of the second artifact.

In operation 905, in an embodiment, the processor 340 may obtain a third image by synthesizing the first image and second image based on the first portion (e.g., first artifact) and second portion (e.g., second artifact).

In an embodiment, the processor 340 may obtain the respective weights for the pixels of the first image and the pixels of the second image.

In an embodiment, the processor 340 may align the first image and the second image based on the center position of the first artifact and the center position of the second artifact. For example, the processor 340 may align the first image and the second image so that the center position of the first artifact and the center position of the second artifact are mapped to coincide with each other in the coordinate system.

In an embodiment, the processor 340 may generate a weight map. For example, the processor 340 may obtain the first subtracted image by subtracting the second image (e.g., the values of the pixels of the aligned second image) from the first image (e.g., the values of the pixels of the aligned first image), for each of the positions of the corresponding pixels. The processor 340 may generate a first weight map including pixels having pixel values greater than or equal to a designated pixel value (e.g., positive pixel value) in the first subtracted image. The processor 340 may obtain the second subtracted image by subtracting the first image (e.g., the values of the pixels of the aligned function image) from the second image (e.g., the values of the pixels of the aligned second image), for each of the positions of the corresponding pixels. The processor 340 may generate a second weight map including pixels having pixel values greater than or equal to a designated pixel value (e.g., positive pixel value) in the second subtracted image.

In an embodiment, the pixels included in the first weight map may be pixels having pixel values larger than the pixel values of other pixels in the first image, and these pixels may constitute the first artifact generated by the first line (and/or first light emitting unit). For example, the first weight map may include pixels corresponding to the first artifact. In an embodiment, the pixels included in the second weight map may be pixels having pixel values larger than the pixel values of other pixels in the second image, and these pixels may constitute the second artifact generated by the second line (and/or second light emitting unit). For example, the second weight map may include pixels corresponding to the second artifact.

In an embodiment, the processor 340 may synthesize the first image and the second image based on the first weight map and the second weight map. For example, the processor 340 may synthesize the first image and the second image by assigning a lower weight to the pixels (e.g., the pixels included in the first weight map and the pixels included in the second weight map) where the first artifact and the second artifact have occurred in the first image and the second image, than the weights assigned to other pixels (e.g., the pixels other than the pixels where the first artifact and the second artifact occur in the first image and the second image). The processor 340 may obtain the third image by synthesizing the first image and the second image.

Although not shown in FIG. 9, in an embodiment, the processor 340 may further perform an operation for restoring (or compensating for) a signal component that has been attenuated in the process of synthesizing the first image and the second image.

Figure 10:
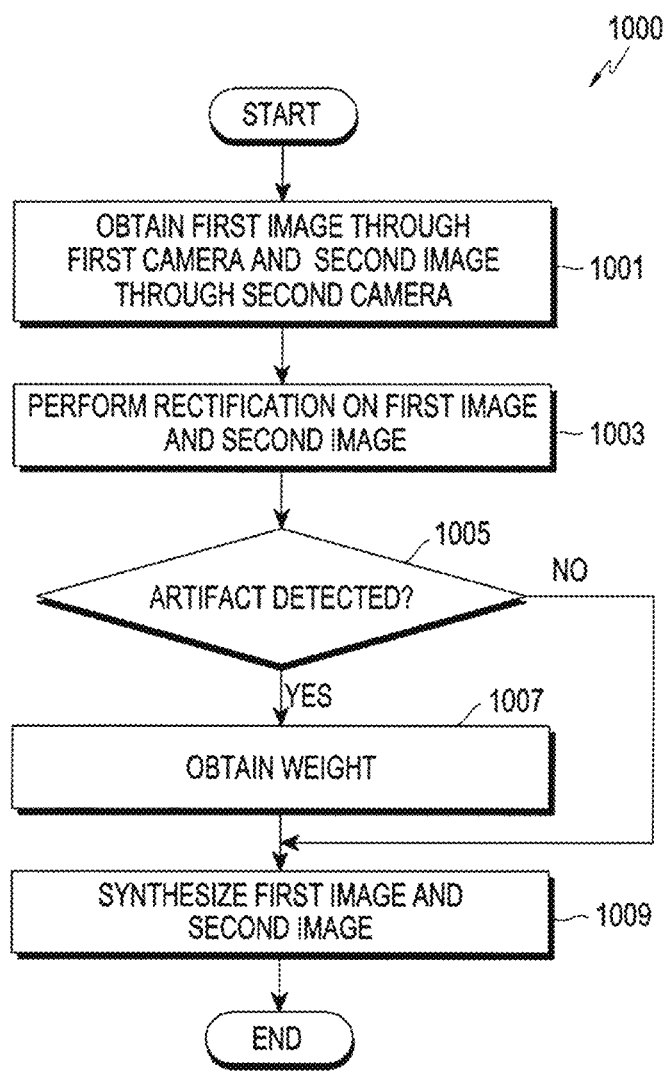
FIG. 10 is a flowchart illustrating a method for providing an image according to an embodiment.

FIG. 10 is a flowchart 1000 illustrating a method for providing an image according to an embodiment.

Referring to FIG. 10, in operation 1001, in an embodiment, the processor 340 may obtain a first image through a first camera and a second image through a second camera of a plurality of cameras.

Since operation 1001 is at least partially the same or similar to the operation 901 of FIG. 9, no detailed description thereof is presented below.

In operation 1003, in an embodiment, the processor 340 may perform rectification on the first image and second image. For example, the processor 340 may map (e.g., align) the first image and the second image to the same coordinate system (e.g., common image plane).

In operation 1005, in an embodiment, the processor 340 may identify whether an artifact (e.g., flare) is detected in the first image (e.g., the first image on which rectification has been performed) and the second image (e.g., the second image on which rectification has been performed). For example, the processor 340 may identify whether the first artifact (e.g., a plurality of pixels having pixel values greater than or equal to a threshold pixel value) is detected in the first image, and the second artifact (e.g., a plurality of pixels having pixel values greater than or equal to the threshold pixel value) is detected in the second image.

The operation of identifying whether the first artifact and the second artifact are detected in the first image and second image by the processor 340 in operation 1005 is the same as the operation of detecting the first artifact generated by the first line and/or first light emitting unit in the first image and the second artifact generated by the second line and/or second light emitting unit in the second image by the processor 340 in operation 903 of FIG. 9, and thus, no detailed description thereof is given.

When artifacts are detected in the first image and second image in operation 1005, the processor 340 may obtain a weight in operation 1007, in an embodiment. For example, the processor 340 may obtain the respective weights for the pixels of the first image and the pixels of the second image. The processor 340 may align the first image and the second image based on the center position of the first artifact and the center position of the second artifact. The processor 340 may generate a weight map. The operation of obtaining the weight by the processor 340 has been described in connection with operation 905 of FIG. 9, and thus, no detailed description thereof is given.

In operation 1009, in an embodiment, the processor 340 may synthesize the first image and second image. For example, when the first weight map and the second weight map are generated in operation 1007, the processor 340 may synthesize the first image and second image based on the generated first weight map and second weight map. In an embodiment, the processor 340 may obtain the third image by synthesizing the first image and second image based on the generated first weight map and second weight map.

In an embodiment, when no artifact is detected in the first image and second image in operation 1005, the processor 340 may synthesize the first image and second image without performing operation 1007. In an embodiment, the processor 340 may obtain the third image by synthesizing the first image and the second image.

Although not shown in FIG. 10, in an embodiment, the processor 340 may further perform an operation for restoring (or compensating for) a signal component that has been attenuated in the process of synthesizing the first image and the second image.

Although a method for providing an image using a plurality of cameras by the electronic device 101 has been described in connection with FIGS. 3 to 10, when the electronic device 101 includes a flexible display, the electronic device 101 may provide an image by performing similar operations than those described in connection with FIGS. 3 to 10, by using one camera. A method for providing an image by the electronic device 101 including a flexible display is described below with reference to FIGS. 11 to 15.

Figure 11:
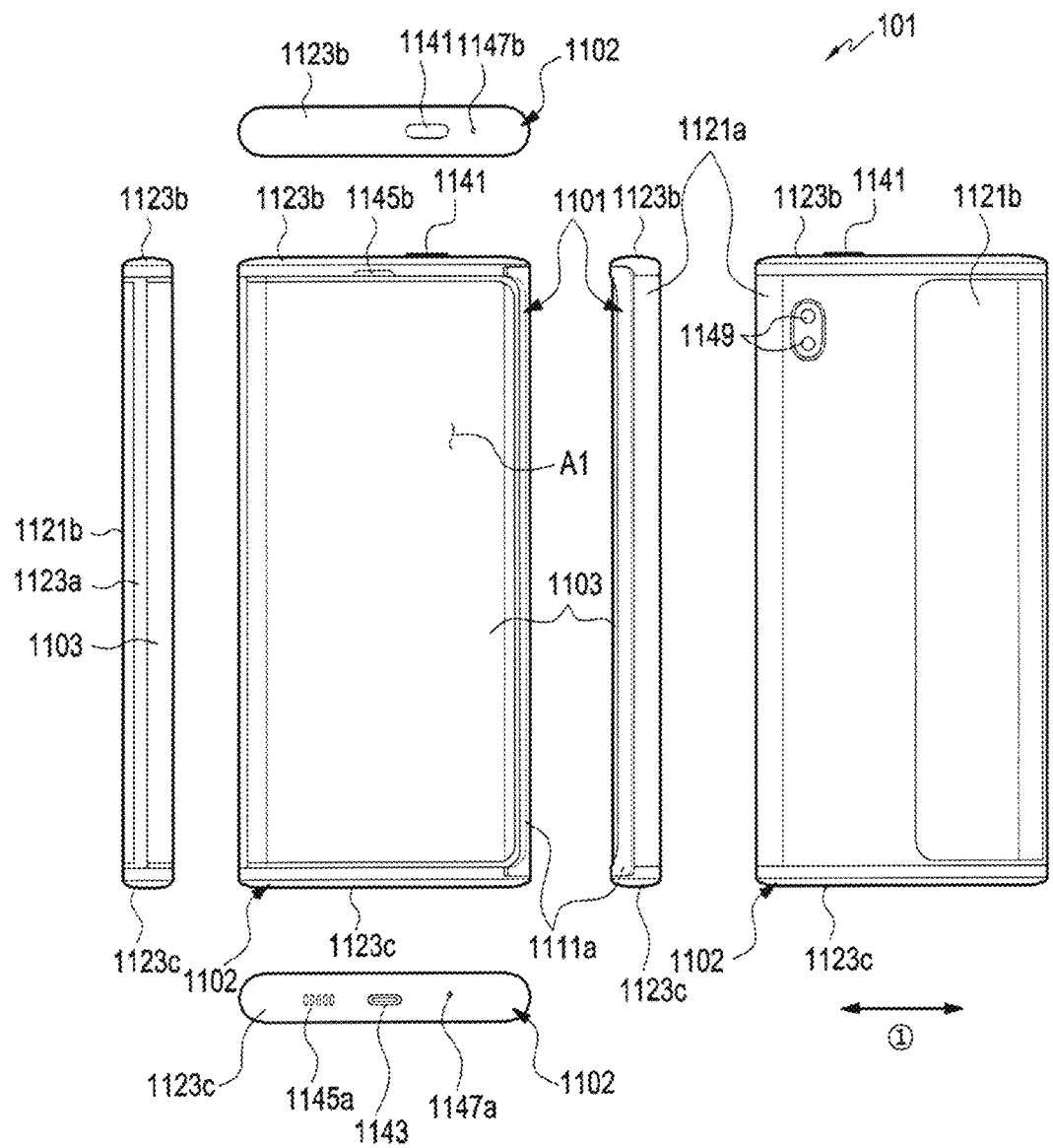
FIG. 11 is a view illustrating an electronic device in a state in which a portion of a flexible display is received in a second structure according to an embodiment.

FIG. 11 is a view illustrating an electronic device 101 in a state in which a portion of a flexible display is inserted in a second structure according to an embodiment.

Figure 12:
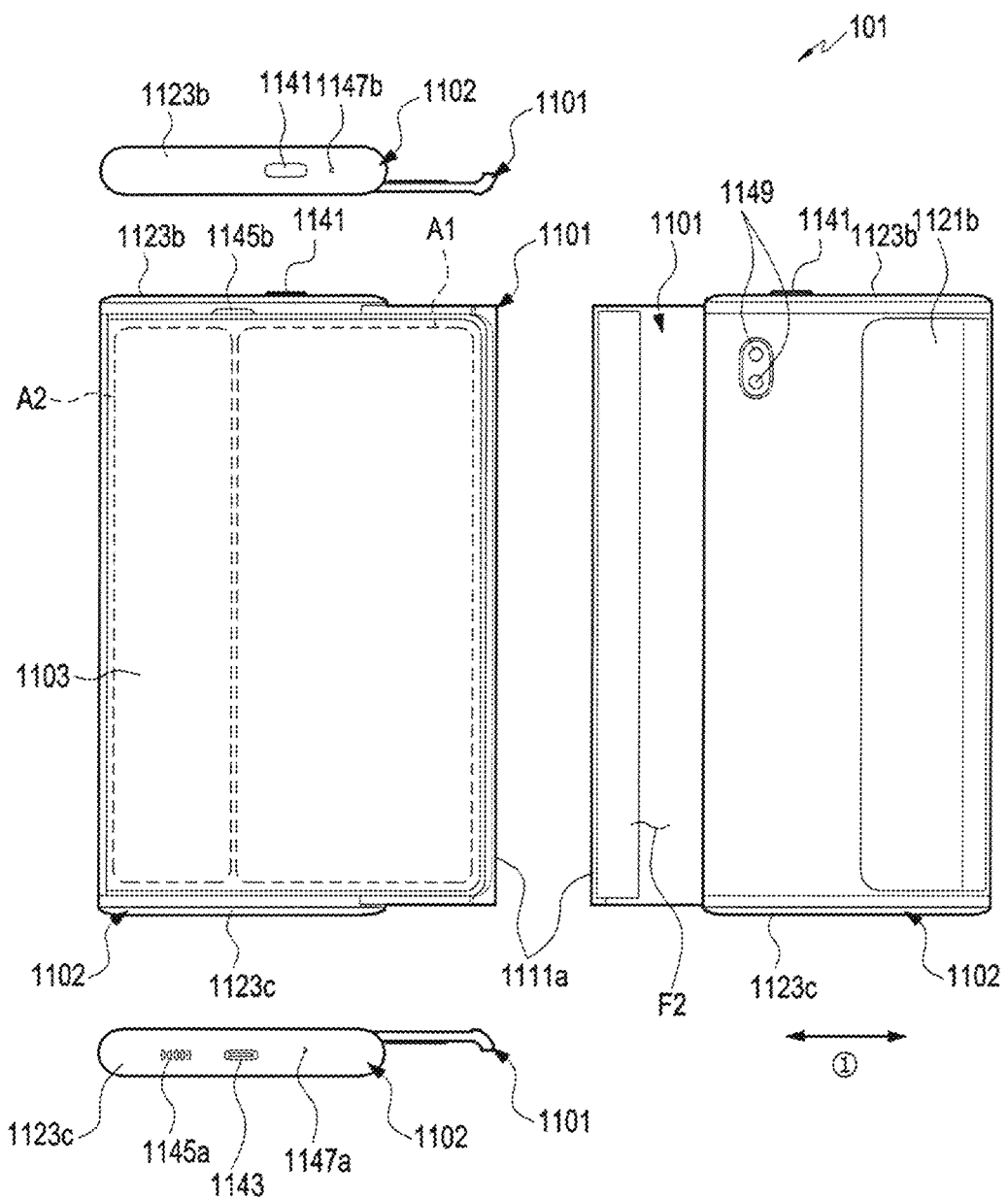
FIG. 12 is a view illustrating an electronic device in a state in which most of a flexible display is exposed to the outside of a second structure according to an embodiment.

FIG. 12 is a view illustrating an electronic device 101 in a state in which most of a flexible display is exposed to the outside of a second structure according to an embodiment.

The state shown in FIG. 11 may be defined as a first structure 1101 being closed with respect to a second structure 1102, and the state shown in FIG. 12 may be defined as the first structure 1101 being open with respect to the second structure 1102. According to an embodiment, the "closed state" or "opened state" may be defined as a closed or open state of the electronic device.

Referring to FIGS. 11 and 12, the electronic device 101 may include a second structure 1102 and a first structure 1101 disposed to be movable in the second structure 1102. According to an embodiment, the electronic device 101 may be interpreted as having a structure in which the first structure 1101 is slidably disposed on the second structure 1102. According to an embodiment, the first structure 1101 may be disposed to perform reciprocating motion by a predetermined distance in a predetermined direction with respect to the second structure 1102, for example, a direction indicated by an arrow (0.

According to an embodiment, the first structure 1101 may be referred to as, for example, a first housing, a slide unit, or a slide housing, and may be disposed to reciprocate on the second structure 1102. According to an embodiment, the second structure 1102 may be referred to as, for example, a second housing, a main part, or a main housing, and may insert various electric or electronic components such as a main circuit board or a battery. A portion (e.g., the first area A1) of the display 1103 (e.g., the display 310 or display module 160) may be seated in the first structure 1101. According to an embodiment, another portion (e.g., the second area A2) of the display 1103 may be inserted (e.g., slide-in) into the inside of the second structure 1102 or visually exposed (e.g., slide-out) to the outside of the second structure 1102 as the first structure 1101 moves (e.g., slides) relative to the second structure 1102.

According to an embodiment, the first structure 1101 may include a first plate 1111a (e.g., slide plate) and may include a first surface formed to include at least a portion of the first plate 1111a and a second surface F2 facing in the direction opposite to the first surface. According to an embodiment, the second structure 1102 may include a second plate 1121a (e.g., rear case), a first sidewall 1123a extending from the second plate 1121a, a second sidewall 1123b extending from the first sidewall 1123a and the second plate 1121a, a third sidewall 1123c extending from the first sidewall 1123a and the second plate 1121a and positioned substantially parallel to the second sidewall 1123b, and/or a rear plate 1121b (e.g., rear window). According to an embodiment, the second sidewall 1123b and the third sidewall 1123c may be formed to be substantially perpendicular to the first sidewall 1123a. According to an embodiment, the second plate 1121a, the first sidewall 1123a, the second sidewall 1123b, and the third sidewall 1123c may be formed to have an opening (e.g., in the front face) to insert (or surround) at least a portion of the first structure 1101. For example, the first structure 1101 may be coupled to the second structure 1102 in a state in which it is at least partially surrounded, and the first structure 1101 may be guided by the second structure 1102 to slide in a direction parallel to the first surface or the second surface, for example, direction indicated with the arrow ①.

According to an embodiment, the second sidewall 1123b or the third sidewall 1123c may be omitted. According to an embodiment, the second plate 1121a, the first sidewall 1123a, the second sidewall 1123b, and/or the third sidewall 1123c may be formed as separate structures and may be combined or assembled. The rear plate 1121b may be coupled to surround at least a portion of the second plate 1121a. In some embodiments, the rear plate 1121b may be formed substantially integrally with the second plate 1121a. According to an embodiment, the second plate 1121a or the rear plate 1121b may cover at least a portion of the flexible display 1103. For example, the flexible display 1103 may be at least partially inserted inside the second structure 1102, and the second plate 1121*a* or the rear plate 1121*b* may cover the portion of the flexible display inserted inside the second structure 1102.

According to an embodiment, the first structure 1101 may be moved in an open state or closed state with respect to the second structure 1102 in a first direction (e.g., direction ( ) substantially parallel with the second plate 1121*a* (e.g., the rear case) and the second side wall 1123*b* to be positioned a first distance away from the first side wall 1123*a* in the closed state and be positioned a second distance away from the first side wall 1123*a* in the open state, wherein the second distance is larger than the first distance. In some embodiments, when in the closed state, the first structure 1101 may be positioned to surround a portion of the first sidewall 1123*a*.

According to an embodiment, the second structure 1102 may at least partially include a non-conductive material (e.g., polymer material (e.g., plastic), glass, or ceramic). For example, the second structure 1102 may be formed by combining a conductive housing and a plate formed of a polymer material.

According to an embodiment, the electronic device 101 may include a display 1103, a key input device 1141, a connector hole 1143, audio modules 1145*a*, 1145*b*, 1147*a*, and 1147*b*, or a camera module 1149. Although not shown, the electronic device 101 may further include an indicator (e.g., a light emitting diode (LED) device) or various sensor modules.

According to an embodiment, the display 1103 may include the first area A1 and the second area A2. In one embodiment, the first area A1 may extend substantially across at least a portion of the first surface and may be disposed on the first surface. The second area A2 may extend from the first area A1 and be inserted or inserted into the inside of the second structure 1102 (e.g., housing) or be exposed to the outside of the structure 1102 as the first structure 1101 slides. As will be described below, the second area A2 may be moved while being substantially guided by a roller (e.g., the roller 1151 of FIG. 14) mounted on the second structure 1102 and may thus be inserted into the inside of or exposed to the outside of the second structure 1102. For example, while the first structure 1101 slides, a portion of the second area A2 may be deformed into a curved shape in a position corresponding to the roller.

According to an embodiment, when viewed from the top of the first plate 1111*a* (e.g., slide plate), when the first structure 1101 moves from the closed state to the open state, the second area A2 may be gradually exposed to the outside of the second structure 1102 to be substantially coplanar with the first area A1. The display 1103 may be disposed to be coupled with, or adjacent, a touch detecting circuit, a pressure sensor capable of measuring the strength (pressure) of touches, and/or a digitizer for detecting a magnetic field-type stylus pen. In one embodiment, the second area A2 may be at least partially inserted inside the second structure 1102, and a portion of the second area A2 may be visually exposed to the outside even in the state shown in FIG. 11 (e.g., the closed state). In some embodiments, irrespective of the closed state or the open state, the exposed portion of the second area A2 may be positioned on the roller and, at the position corresponding to the roller, a portion of the second area A2 may maintain the curved shape.

The key input device 1141 may be disposed on the second sidewall 1123*b* or the third sidewall 1123*c* of the second structure 1102. Depending on the appearance and the state of use, the electronic device 101 may be designed to omit the illustrated key input device 1141 or to include additional key input device(s). According to an embodiment, the electronic device 101 may include a key input device (not shown), e.g., a home key button or a touchpad disposed around the home key button. According to an embodiment, at least a portion of the key input device 1141 may be positioned on an area of the first structure 1101.

According to an embodiment, the connector hole 1143 may be omitted or may insert a connector (e.g., a universal serial bus (USB) connector) for transmitting and receiving power and/or data with an external electronic device. Although not shown, the electronic device 101 may include a plurality of connector holes 1143, and some of the plurality of connector holes 1143 may function as connector holes for transmitting/receiving audio signals with an external electronic device. In the illustrated embodiment, the connector hole 1143 is disposed on the third side wall 1123*c*, but is not limited thereto. For example, the connector hole 1143 or a connector hole not shown may be disposed on the first side wall 1123*a* or the second sidewall 1123*b*.

According to an embodiment, the audio modules 1145*a*, 1145*b*, 1147*a*, and 1147*b* may include speaker holes 1145*a* and 1145*b* or microphone holes 1147*a* and 1147*b*. One of the speaker holes 1145*a* and 1145*b* may be provided as a receiver hole for voice calls, and the other may be provided as an external speaker hole. The microphone holes 1147*a* and 1147*b* may have a microphone inside to obtain external sounds. According to an embodiment, there may be a plurality of microphones to be able to detect the direction of a sound. In some embodiments, the speaker holes 1145*a* and 1145*b* and the microphone holes 1147*a* and 1147*b* may be implemented as one hole, or a speaker may be included without the speaker holes 1145*a* and 1145*b* (e.g., a piezo speaker). According to, the speaker hole indicated by the reference number "1145*b*" may be disposed in the first structure 1101 and used as a receiver hole for voice calls, and the speaker hole indicated by the reference number "1145*a*" (e.g., an external speaker hole) or the microphone holes 1147*a* and 1147*b* may be disposed in the second structure 1102 (e.g., one of the sidewalls 1123*a*, 1123*b*, and 1123*c*).

The camera module 1149 may be provided on the second structure 1102 and may capture a subject in a direction opposite to the first area A1 of the display 1103. The electronic device 101 may include a camera module 1149. For example, the electronic device 101 may include a wide-angle camera, a telephoto camera, or a close-up camera, and according to an embodiment, by including an infrared projector and/or an infrared receiver, the electronic device 101 may measure the distance to the subject. The camera module 1149 may include one or more lenses, an image sensor, and/or an image signal processor. Although not shown, the electronic device 101 may further include a camera module (e.g., an under display camera (UDC)) that captures a subject positioned in a direction in which the first area A1 and/or the second area A2 of the display 1103 faces. For example, the UDC may capture the subject through one of a plurality of UDC areas included in the display 1103.

According to an embodiment, an indicator (not shown) of the electronic device 101 may be disposed on the first structure 1101 or the second structure 1102, and the indicator may include a light emitting diode to provide state information about the electronic device 101 as a visual signal. The sensor module (not shown) of the electronic device 101 may produce an electrical signal or data value corresponding to the internal operation state or external environment state of the electronic device. The sensor module may include, for example, a proximity sensor, a fingerprint sensor, or a biometric sensor (e.g., an iris/face recognition sensor or a heartrate monitor (HRM) sensor). According to another embodiment, the sensor module may further include, e.g., at least one of a gesture sensor, a gyro sensor, an atmospheric pressure sensor, a magnetic sensor, an acceleration sensor, a grip sensor, a color sensor, an infrared (IR) sensor, a temperature sensor, a humidity sensor, or an illuminance sensor.

Figure 13:
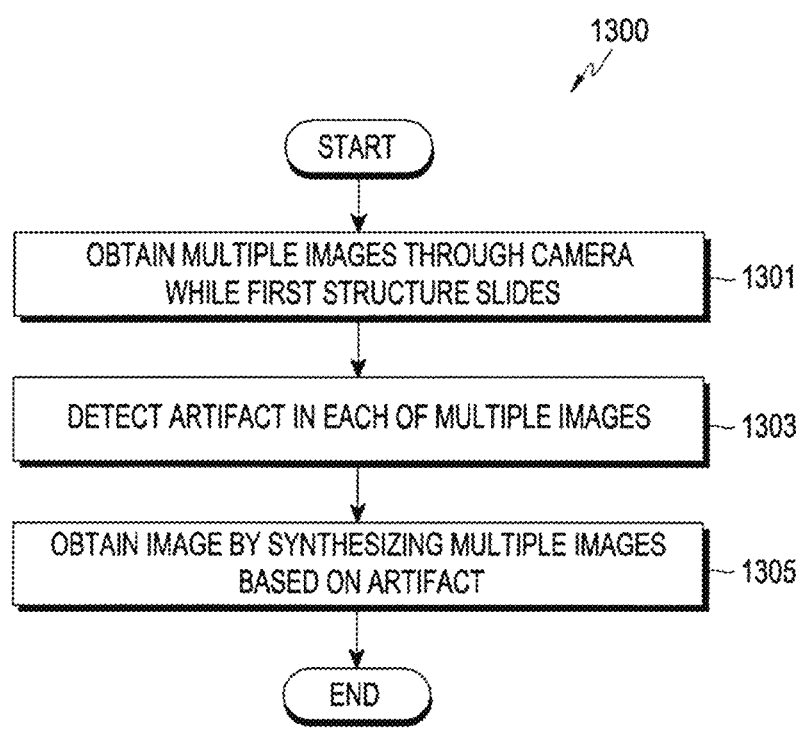
FIG. 13 is a flowchart illustrating a method for obtaining a plurality of images while a first structure of an electronic device slides according to an embodiment.

FIG. 13 is a flowchart 1300 illustrating a method for obtaining a plurality of images while a first structure of an electronic device 101 slides according to an embodiment.

Figure 14:
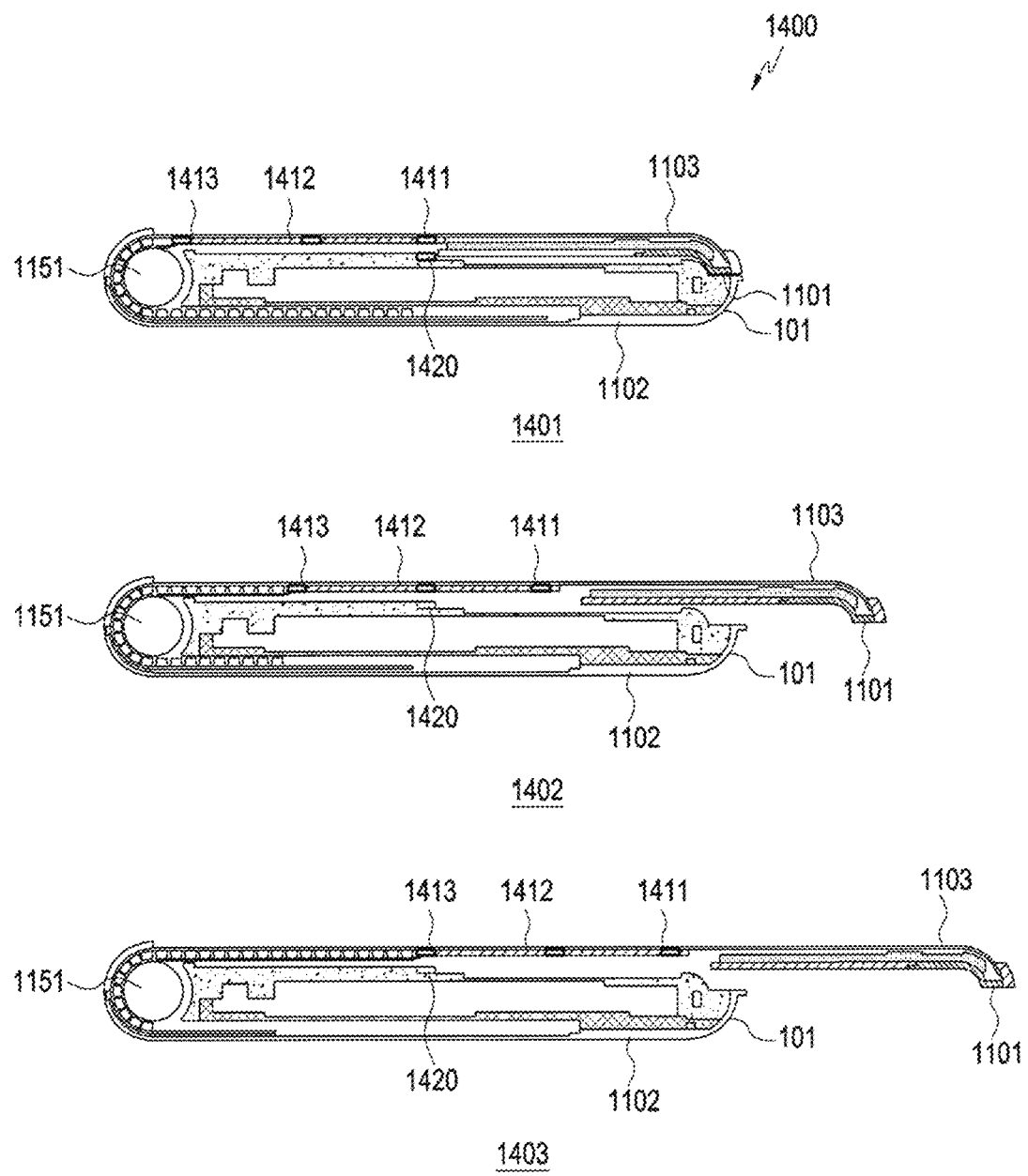
FIG. 14 is a view illustrating an example of a method for obtaining a plurality of images while a first structure of an electronic device slides according to an embodiment.

FIG. 14 is a view 1400 illustrating an example of a method for obtaining a plurality of images while a first structure of an electronic device 101 slides according to an embodiment. In an embodiment, FIG. 14 may show cross sections in bottom views of FIGS. 11 and 12.

Figure 15:
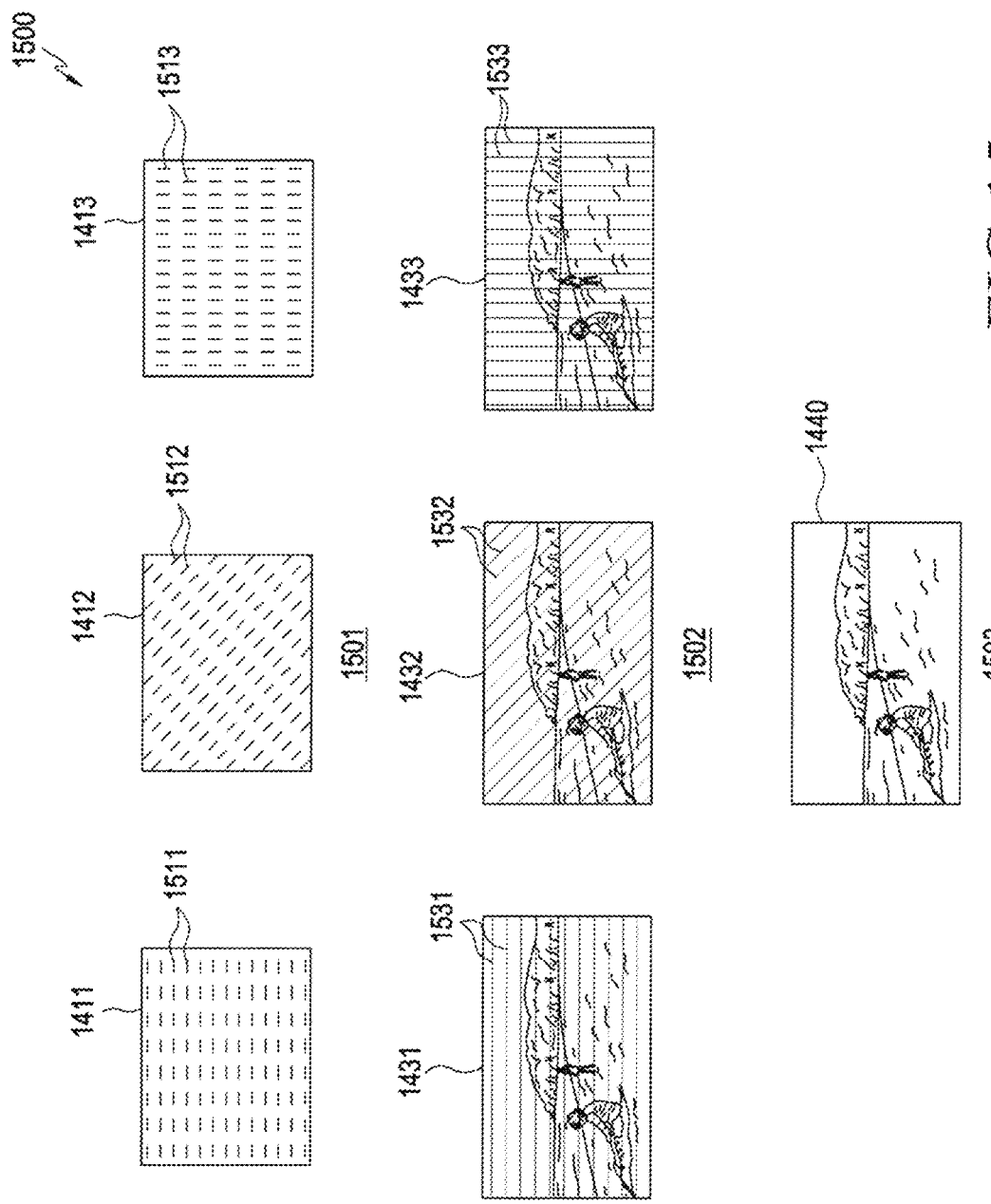
FIG. 15 is a view illustrating a method for providing an image in an electronic device including a flexible display according to an embodiment.

FIG. 15 is a view 1500 illustrating a method for providing an image in an electronic device 101 including a flexible display according to an embodiment.

Referring to FIGS. 13 and 15, in operation 1301, in an embodiment, the processor 340 may obtain a plurality of images through a camera (e.g., the camera module 320) (e.g., one UDC) while the first structure slides on the second structure.

In an embodiment, the flexible display (e.g., the display 310 or the display 1103) may include a plurality of UDC areas. In an embodiment, each of the plurality of UDC areas may include a plurality of slits arranged in different directions. For example, as shown as reference number 1501, when the plurality of UDC areas include a first UDC area 1411, a second UDC area 1412, and a third UDC area 1413, the first direction (e.g., horizontal direction or left/lower direction) of the plurality of slits 1511 included in the first UDC area 1411, the second direction (e.g., a diagonal direction) of the plurality of slits 1512 included in the second UDC area 1412, and the third direction (e.g., vertical direction or upper/lower direction) of the plurality of slits 1513 included in the third UDC area 1413 may differ from each other.

In an embodiment, each of the plurality of slits may be an area through which the light is introduced from the outside to the camera. In an embodiment, each of the plurality of slits may be a transparent slit.

In an embodiment, in each of the plurality of UDC areas, in the area other than the plurality of slits (e.g., the area other than the plurality of slits 1511 in the first UDC area 1411 of reference number 1501), the light emitting unit and the line connected with the light emitting unit may be disposed and, in the non-UDC area (e.g., the area other than the plurality of UDC areas of the flexible display), the light emitting circuit connected with the light emitting unit through the line may be disposed. However, embodiments of the disclosure are not limited thereto. For example, in each of the plurality of UDC areas, the light emitting unit and the light emitting circuit may be disposed in the area other than the plurality of slits.

In an embodiment, upon receiving an input for obtaining an image, the processor 340 may sequentially obtain a plurality of images through the camera (e.g., one camera disposed in the second structure 1102) while the first structure 1101 slides. For example, as shown in reference number 1401, reference number 1402, and reference number 1403, upon receiving an input for obtaining an image, the processor 340 may obtain a first image using the light passing through the first UDC area 1411, through the camera 1420 disposed in the second structure 1102. The processor 340 may slide the first structure 1101 to allow the position of the second UDC area 1412 to correspond to the position of the camera 1420 after obtaining the first image. The processor 340 may obtain a second image using the light passing through the second UDC area 1412 after the first structure 1101 slides so that the position of the second UDC area 1412 corresponds to the position of the camera 1420. The processor 340 may slide the first structure 1101 to allow the position of the third UDC area 1413 to correspond to the position of the camera 1420 after obtaining the second image. The processor 340 may obtain a third image using the light passing through the third UDC area 1413 after the first structure 1101 slides so that the position of the third UDC area 1413 corresponds to the position of the camera 1420.

Although FIG. 14 exemplifies that the flexible display includes three UDC areas, embodiments are not limited thereto. For example, the flexible display may include two UDC areas or may include four or more UDC areas.

Although FIG. 14 exemplifies that the camera obtains a plurality of images while switching from a state (e.g., the state of the electronic device 101 denoted by reference number 1401) in which the first structure 1101 is closed with respect to the second structure 1102 to a state (e.g., the state of the electronic device 101 denoted by reference number 1403) in which the first structure 1101 is open with respect to the second structure 1102. For example, the above-described examples may also be applied, in the same or similar manner, to the example in which the camera obtains a plurality of images while switching from the state in which the first structure 1101 is open with respect to the second structure 1102 to the state in which the first structure 1101 is closed with respect to the second structure 1102.

In operation 1303, in an embodiment, the processor 340 may detect an artifact (e.g., flare) from each of the plurality of images based on the plurality of images (e.g., the first image, the second image, and the third image).

In an embodiment, artifacts may occur in each of the plurality of images. For example, as shown as reference number 1502, a first artifact 1531 may be generated along the first direction in the first image 1431 obtained in the first UDC area 1411 including the slits 1511 arranged in the first direction (e.g., horizontal direction), a second artifact 1532 may be generated along the second direction in the second image 1432 obtained in the second UDC area 1412 including the slits 1512 arranged in the second direction (e.g., a diagonal direction), and a third artifact 1533 may be generated along the third direction in the third image 1433 obtained in the third UDC area 1413 including the slits 1513 arranged in the third direction (e.g., upper/lower direction).

In an embodiment, the artifact generated in each of the plurality of images may be generated by the components (e.g., the light emitting unit and line or the light emitting unit and light emitting circuit) included in the area other than the area where the slits are arranged in each of the UDC areas.

In an embodiment, the operation of detecting an artifact in each of a plurality of images based on the plurality of images by the processor 340 is at least partially identical or similar to operation 903 of FIG. 9, and thus, no detailed description thereof is given.

In operation 1305, in an embodiment, the processor 340 may obtain an image (e.g., a synthesized image) by synthesizing a plurality of images based on the artifact (e.g., the artifacts generated in each of the plurality of images).

In an embodiment, the operation of synthesizing the plurality of images based on the artifact by the processor 340 is at least partially identical or similar to operation 905 of FIG. 9, and thus, no detailed description thereof is given.

In an embodiment, when the processor 340 synthesizes the plurality of images based on the artifact, an image 1440 with artifacts removed may be obtained as shown as reference number 1503.

According to an embodiment, an electronic device 101 may comprise a first structure 1101, a second structure 1102 configured to guide a slide of the first structure 1101, a flexible display (e.g., the display 1103) at least partially inserted into an inside of the second structure 1102 or visually exposed to an outside of the second structure 1102 as the first structure 1101 slides and including a plurality of areas each of which includes a plurality of slits arranged in different directions, a camera (e.g., the camera 1420) configured to obtain an image using light introduced through at least one of the plurality of areas, and at least one processor 340 electrically connected with the flexible display and the camera. The at least one processor 340 may be configured to obtain a plurality of images using the camera while the first structure 1101 slides with respect to the second structure 1102, detect an artifact in each of the plurality of images, and obtain an image by synthesizing the plurality of images based on the artifact.

According to an embodiment, the at least one processor 340 may be configured to, upon receiving an input for obtaining the image using the camera, control slide of the first structure 1101 with respect to the second structure 1102 so as to allow a position of each of the plurality of areas to sequentially correspond to a position of the camera, and continuously obtain the plurality of images using light introduced to the camera through each of the plurality of areas, using the camera while the first structure 1101 slides with respect to the second structure 1102.

Further, the structure of the data used in embodiments of the disclosure may be recorded in a computer-readable recording medium via various means. The computer-readable recording medium includes a storage medium, such as a magnetic storage medium (e.g., a ROM, a floppy disc, or a hard disc) or an optical reading medium (e.g., a CD-ROM or a DVD).

Example embodiments of the disclosure have been described above. The above-described embodiments are merely examples, and it will be appreciated by one of ordinary skill in the art various changes may be made thereto without departing from the scope of the present invention. Hence, the methods disclosed herein should be interpreted not as limiting but as illustrative. The scope of the disclosure should be construed by the following claims, and all technical spirits within equivalents thereof should be interpreted to belong to the scope of the disclosure.

What is claimed is:

1. An electronic device comprising:
   a camera module including a first camera configured to obtain an image using light introduced through a first area of a display and a second camera configured to obtain an image using light introduced through a second area of the display;
   the display including the first area, the second area, and a third area other than the first area and the second area; and
   at least one processor electrically connected with the display and the camera module,
   wherein the first area includes a first light emitting unit and a first line connecting the first light emitting unit and a first light emitting circuit disposed in the third area, the first line being arranged in a first direction, and
   wherein the second area includes a second light emitting unit and a second line connecting the second light emitting unit and a second light emitting circuit disposed in the third area, the second line being arranged in a second direction different from the first direction.

2. The electronic device of claim 1, wherein the first line and the second line are transparent lines.

3. The electronic device of claim 1,
   wherein the first light emitting circuit is configured to transfer a data signal to the first light emitting unit through the first line, and
   wherein the second light emitting circuit is configured to transfer a data signal to the second light emitting unit through the second line.

4. The electronic device of claim 1, wherein pixels per inch (PPI) of the first area and PPI of the second area are lower than PPI of the third area.

5. The electronic device of claim 1, wherein the first direction is a left or right direction, and the second direction is a vertical direction.

6. The electronic device of claim 1, wherein the first camera is disposed under the first area, and the second camera is disposed under the second area.

7. An electronic device comprising:
   a display including a first area having a first light emitting unit connected with a first line arranged in a first direction and a second area having a second light emitting unit connected with a second line arranged in a second direction different from the first direction;
   a camera module including a first camera configured to obtain a first image using light introduced through the first area and a second camera configured to obtain a second image using light introduced through the second area; and
   at least one processor electrically connected with the display and the camera module,
   wherein the at least one processor is configured to:
   obtain the first image through the first camera and the second image through the second camera,
   detect a first portion generated by the first line in the first image and a second portion generated by the second line in the second image, and
   obtain a third image by synthesizing the first image and the second image based on the first portion and the second portion.

8. The electronic device of claim 7, wherein the at least one processor is configured to detect, as the first portion, a plurality of pixels having pixel values greater than or equal to a threshold pixel value in the first image, and detect, as the second portion, a plurality of pixels having pixel values greater than or equal to the threshold pixel value in the second image.

9. The electronic device of claim 7, wherein the at least one processor is configured to:
   detect a center position of the first portion in the first image, wherein a number of pixels having pixel values greater than or equal to a threshold pixel value and distributed in the first portion is greater than or equal to a designated number,
   detect a center position of the second portion in the second image, wherein a number of pixels having pixel values greater than or equal to the threshold pixel value and distributed in the second portion is greater than or equal to the designated number,
   detect the first portion generated in the first direction with respect to the center position of the first portion, and
   detect the second portion generated in the second direction with respect to the center position of the second portion.

10. The electronic device of claim 9, wherein the at least one processor is configured to:
obtain weights for each of pixels of the first image and for each of pixels of the second image, and
obtain the third image by synthesizing the first image and the second image, based on the weights.

11. The electronic device of claim 10, wherein the at least one processor is configured to:
align the first image and the second image based on the center position of the first portion and the center position of the second portion,
generate a first weight map including pixels corresponding to the first portion by subtracting the aligned second image from the aligned first image, for each of positions of corresponding pixels, and
generate a second weight map including pixels corresponding to the second portion by subtracting the aligned first image from the aligned second image, for each of positions of corresponding pixels.

12. The electronic device of claim 11, wherein the at least one processor is configured to synthesize the first image and the second image by assigning lower weights to pixels included in the first weight map and pixels included in the second weight map than weights assigned to remaining pixels of the first image and the second image.

13. The electronic device of claim 7, wherein the first line and the second line are transparent lines.

14. The electronic device of claim 7, wherein the first line is configured to connect the first light emitting unit with a first light emitting circuit disposed in a third area other than the first area and the second area in the display, and
wherein the second line is configured to connect the second light emitting unit with a second light emitting circuit disposed in the third area.

15. The electronic device of claim 14, wherein the first light emitting circuit is configured to transfer a data signal to the first light emitting unit through the first line, and
wherein the second light emitting circuit is configured to transfer a data signal to the second light emitting unit through the second line.

16. The electronic device of claim 14, wherein pixels per inch (PPI) of the first area and PPI of the second area are lower than PPI of the third area.

17. The electronic device of claim 7, wherein the first portion and the second portion include flares.

18. The electronic device of claim 17, wherein the first portion is generated as light introduced through the first area is diffracted by the first line, and
wherein the second portion is generated as light introduced through the second area is diffracted by the second line.

* * * * *